United States Patent
Choi

(10) Patent No.: US 12,557,488 B2
(45) Date of Patent: Feb. 17, 2026

(54) DISPLAY DEVICE

(71) Applicant: Samsung Display Co., LTD., Yongin-si (KR)

(72) Inventor: Jong Hyun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/931,547

(22) Filed: Oct. 30, 2024

(65) Prior Publication Data
US 2025/0311560 A1    Oct. 2, 2025

(30) Foreign Application Priority Data

Mar. 29, 2024  (KR) .................... 10-2024-0043248

(51) Int. Cl.
| | |
|---|---|
| *H10K 59/124* | (2023.01) |
| *G09G 3/00* | (2006.01) |
| *G09G 3/3233* | (2016.01) |
| *G09G 3/3266* | (2016.01) |
| *H10K 59/131* | (2023.01) |

(52) U.S. Cl.
CPC ........... *H10K 59/124* (2023.02); *G09G 3/035* (2020.08); *G09G 3/3233* (2013.01); *G09G 3/3266* (2013.01); *H10K 59/131* (2023.02); *G09G 2300/0819* (2013.01); *G09G 2300/0852* (2013.01); *G09G 2300/0861* (2013.01); *G09G 2310/0286* (2013.01)

(58) Field of Classification Search
CPC ........... H10K 59/00–95; H10K 59/873; H10K 59/122; H10K 59/124; H10K 59/12; H10K 71/00; H10K 59/1213; H10K 77/111; H10K 59/1201; H10K 59/131; H10K 59/8731; H10K 59/1315; H10K 59/121; H10K 59/8723
See application file for complete search history.

(56) References Cited

U.S. PATENT DOCUMENTS 11,435,792 B2    9/2022    Hu et al.

*Primary Examiner* — Sanjiv D. Patel
(74) *Attorney, Agent, or Firm* — CANTOR COLBURN LLP

(57) ABSTRACT

A display device includes a substrate including a display area including emission areas and a non-display area; a circuit layer disposed on the substrate; and an element layer. The circuit layer includes a substrate buffer layer disposed on the substrate; a semiconductor layer disposed on the substrate buffer layer; a first gate insulating layer covering the semiconductor layer; a first gate conductive layer disposed on the first gate insulating layer; a second gate insulating layer covering the first gate conductive layer; a second gate conductive layer disposed on the second gate insulating layer; an interlayer insulating layer covering the second gate conductive layer; a grid defined by grooves defined in the display area and the non-display area, where the grooves includes first extension grooves and second extension grooves which intersect the first extension grooves; and a grid filling layer which fills the grid and includes an organic insulating material.

20 Claims, 19 Drawing Sheets

GL: GWL, GIL, ECL, GCL

DISPLAY DEVICE

This application claims priority to Korean Patent Application No. 10-2024-0043248, filed on Mar. 29, 2024, and all the benefits accruing therefrom under 35 U.S.C. § 119, the content of which in its entirety is herein incorporated by reference.

BACKGROUND

1. Field

Embodiments of the disclosure relate to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions.

The display device may be a flat panel display device such as a liquid crystal display device, a field emission display device or a light emitting display device. Examples of the light emitting display device may include an organic light emitting display device including organic light emitting elements, an inorganic light emitting display device including inorganic light emitting elements such as inorganic semiconductors, and a micro light emitting display device including micro light emitting elements.

The organic light emitting display device displays an image using light emitting elements, each including a light emitting layer made of an organic light emitting material. As described above, the organic light emitting display device implements image display using a self-light emitting element, and thus may have relatively desired features in power consumption, response speed, luminous efficiency, luminance, and wide viewing angle compared to other types of display device.

In the display device, a display surface from which light is emitted may include a display area in which an image is displayed, and a non-display area around the display area. Emission areas for emitting light with respective luminances and colors may be arranged in the display area.

SUMMARY

During a manufacturing process and use of a display device, external impact may be applied to the display device due to situations such as collision with other objects or falling of a device. When such external impact is greater than or equal to a critical level, the display device may be easily deformed or damaged, such that the lifespan and convenience of the display device may be reduced.

Additionally, in a display device where a portion of the display device is transformed into a folded, bent, or rolled form, bending stress may be applied to the folded, bent, or rolled portion, which may be more vulnerable to external impact.

In view of the above, embodiments of the disclosure provide a display device capable of alleviating external impact or reducing impact transmission by improving stretchability.

According to an embodiment of the disclosure, a display device includes a substrate comprising a display area in which emission areas are arranged and a non-display area disposed around the display area; a circuit layer disposed on the substrate; and an element layer disposed on the circuit layer. In such an embodiment, the circuit layer includes a substrate buffer layer disposed on the substrate; a semiconductor layer disposed on the substrate buffer layer; a first gate insulating layer covering the semiconductor layer; a first gate conductive layer disposed on the first gate insulating layer; a second gate insulating layer covering the first gate conductive layer; a second gate conductive layer disposed on the second gate insulating layer; an interlayer insulating layer covering the second gate conductive layer; a grid defined by grooves defined in the display area and the non-display area, where the grooves includes first extension grooves and second extension grooves which intersect the first extension grooves; and a grid filling layer which fills the grid and includes an organic insulating material.

In an embodiment, the grid may expose a part of each of the substrate, the first gate conductive layer, and the second gate conductive layer.

In an embodiment, the element layer may include light emitting elements disposed in the emission areas, respectively. In such an embodiment, the circuit layer may further include light emitting pixel drivers electrically connected to the light emitting elements, respectively; gate lines which transmit a gate signal to the light emitting pixel drivers; and a gate driving circuit disposed in a gate driving area of the non-display area, where the gate driving circuit supplies the gate signal to the gate lines. In such an embodiment, the gate driving circuit includes stages electrically connected to the gate lines, respectively. In such an embodiment, in an extension direction of the second extension grooves, one or more light emitting pixel drivers and one or more stages may be disposed between two adjacent first extension grooves among the first extension grooves of the grid. In such an embodiment, in an extension direction of the first extension grooves, one or more light emitting pixel drivers may be disposed between two adjacent second extension grooves in the display area among the second extension grooves of the grid.

In an embodiment, the gate lines may include scan write lines which transmit a scan write signal; scan initialization lines which transmit a scan initialization signal; emission control lines which transmit an emission control signal; and gate control lines which transmit a gate control signal. In such an embodiment, the stages of the gate driving circuit may include initialization stages arranged in a first circuit area of the gate driving area, and electrically connected to the scan initialization lines and the gate control lines; write stages arranged in a second circuit area of the gate driving area, and electrically connected to the scan write lines; and emission control stages arranged in a third circuit area of the gate driving area, and electrically connected to the emission control lines. In such an embodiment, at least one of the second extension grooves among the second extension grooves of the grid may be disposed in the non-display area between the first circuit area, the second circuit area, and the third circuit area.

In an embodiment, the non-display area may further include an extension line area disposed between the gate driving area and the display area. In such an embodiment, the circuit layer may further include gate extension lines disposed in the extension line area and electrically connected between the stages and the gate lines. In such an embodiment, two second extension grooves among the second extension grooves of the grid may be disposed at opposing sides of the extension line area, respectively.

In an embodiment, one light emitting pixel driver electrically connected to one light emitting element among the light emitting pixel drivers may include a first transistor electrically connected between a first node and a second node; a pixel capacitor electrically connected between a first power line and a third node; a second transistor electrically connected between a data line, which transmits a data signal, and the third node; a third transistor electrically connected between the second node and the third node; a fourth transistor electrically connected between a first initialization voltage line which transmit a first initialization voltage and the third node; a fifth transistor electrically connected between the first power line and the first node; a sixth transistor electrically connected between the second node and a fourth node; and a seventh transistor electrically connected between a second initialization voltage line, which transmits a second initialization voltage, and the fourth node. In such an embodiment, the first node is electrically connected to a first electrode of the first transistor, the second node is electrically connected to a second electrode of the first transistor, the third node is electrically connected to a gate electrode of the first transistor, and the fourth node is electrically connected to the one light emitting element. In such an embodiment, each of the second transistor and the third transistor is turned on by the scan write signal, the fourth transistor is turned on by the scan initialization signal, each of the fifth transistor and the sixth transistor is turned on by the emission control signal, and the seventh transistor is turned on by the gate control signal.

In an embodiment, the grid may be spaced apart from the semiconductor layer in a plan view.

In an embodiment, the circuit layer may further include a supply line disposed in the non-display area and surrounding at least a part of an edge portion of the display area. In such an embodiment, a part of the supply line overlaps the gate driving area in the plan view.

In an embodiment, the circuit layer may further include a first source-drain conductive layer disposed on the interlayer insulating layer; a first planarization layer covering the first source-drain conductive layer and the grid; a second source-drain conductive layer disposed on the first planarization layer; and a second planarization layer covering the second source-drain conductive layer. In such an embodiment, the supply line may be disposed on the second source-drain conductive layer.

In an embodiment, two or more exposed holes may be defined through the supply line to be spaced apart from each other in the plan view. In such an embodiment, the second planarization layer may be in contact with the first planarization layer through the two or more exposed holes, and two or more of intersection portions between the first extension grooves and the second extension grooves may overlap the two or more exposed holes, respectively, in the plan view.

In an embodiment, the circuit layer further includes a grid buffer layer disposed between the grid and the grid filling layer and including an inorganic insulating material.

In an embodiment, the circuit layer may further include an additional semiconductor layer disposed on the interlayer insulating layer; a third gate insulating layer covering the additional semiconductor layer; a third gate conductive layer disposed on the third gate insulating layer; and an additional interlayer insulating layer covering the third gate conductive layer. In such an embodiment, the grid may further expose a part of the third gate conductive layer.

According to an embodiment of the disclosure, a display device includes a substrate including a display area in which emission areas are arranged and a non-display area disposed around the display area; a circuit layer disposed on the substrate; and an element layer disposed on the circuit layer. In such an embodiment, the element layer includes light emitting elements disposed in the emission areas, respectively. In such an embodiment, the circuit layer includes light emitting pixel drivers electrically connected to the light emitting elements, respectively; gate lines which transmit a gate signal to the light emitting pixel drivers; a gate driving circuit disposed in a gate driving area of the non-display area and including stages electrically connected to the gate lines, respectively. In such an embodiment, two or more insulating layers disposed on the substrate and including an inorganic insulating material; a grid defined by grooves defined in at least some of boundaries between the light emitting pixel drivers and at least some of boundaries between the stages through the two or more insulating layers; and a grid filling layer which fills the grid and includes an organic insulating material.

In an embodiment, the two or more insulating layers may include a substrate buffer layer disposed on the substrate; a first gate insulating layer disposed on the substrate buffer layer; a second gate insulating layer disposed on the first gate insulating layer; and an interlayer insulating layer disposed on the second gate insulating layer. In such an embodiment, the circuit layer may further include a semiconductor layer disposed between the substrate buffer layer and the first gate insulating layer; a first gate conductive layer disposed between the first gate insulating layer and the second gate insulating layer; and a second gate conductive layer disposed between the second gate insulating layer and the interlayer insulating layer. In such an embodiment, the grid may expose a part of each of the substrate, the first gate conductive layer, and the second gate conductive layer, and may be spaced apart from the semiconductor layer in a plan view.

In an embodiment, the grooves of the grid may include first extension grooves and second extension grooves which intersect the first extension grooves. In such an embodiment, in an extension direction of the second extension grooves, one or more light emitting pixel drivers and one or more stages may be disposed between two adjacent first extension grooves among the first extension grooves of the grid. In such an embodiment, in an extension direction of the first extension grooves, one or more light emitting pixel drivers may be disposed between two adjacent second extension grooves disposed in the display area among the second extension grooves of the grid.

In an embodiment, the gate lines may include scan write lines which transmit a scan write signal; scan initialization lines which transmit a scan initialization signal; emission control lines which transmit an emission control signal; and gate control lines which transmit a gate control signal. In such an embodiment, the stages of the gate driving circuit may include initialization stages arranged in a first circuit area of the gate driving area, and electrically connected to the scan initialization lines and the gate control lines; write stages arranged in a second circuit area of the gate driving area, and electrically connected to the scan write lines; and emission control stages arranged in a third circuit area of the gate driving area, and electrically connected to the emission control lines. In such an embodiment, at least one of the second extension grooves among the second extension grooves of the grid may be disposed in the non-display area between the first circuit area, the second circuit area, and the third circuit area.

In an embodiment, the non-display area may further include an extension line area disposed between the gate driving area and the display area. In such an embodiment, the circuit layer may further include gate extension lines disposed in the extension line area and electrically connected between the stages and the gate lines. In such an embodiment, two second extension grooves among the second extension grooves of the grid may be disposed at opposing sides of the extension line area, respectively.

In an embodiment, the circuit layer may further include a first source-drain conductive layer disposed on the interlayer insulating layer; a first planarization layer covering the first source-drain conductive layer and the grid; a second source-drain conductive layer disposed on the first planarization layer; a second planarization layer covering the second source-drain conductive layer; and a supply line disposed in the non-display area and surrounding three sides of the display area. In such an embodiment, the supply line may be disposed in the second source-drain conductive layer, and a part of the supply line may overlap the gate driving area in the plan view.

In an embodiment, t two or more exposed holes may be defined through the supply line to be spaced apart from each other in the plan view. In such an embodiment, the second planarization layer may be in contact with the first planarization layer through the two or more exposed holes. In such an embodiment, two or more of intersection portions between the first extension grooves and the second extension grooves overlap the two or more exposed holes, respectively, in the plan view.

In an embodiment, the circuit layer may further include a grid buffer layer disposed between the grid and the grid filling layer and including an inorganic insulating material.

According to embodiments, a circuit layer of the display device includes a grid including first extension grooves and second extension grooves that intersect the first extension grooves, and a grid filling layer that fills the grid and includes an organic insulating material.

In such embodiments, the grid may include the first extension grooves and the second extension grooves that intersect the first extension grooves.

In such embodiments, the grid may be provided by forming grooves through one or more insulating layers, each including an inorganic insulating material, and may be filled with the grid filling layer including an organic insulating material.

In such embodiments, by providing the grid and the grid filling layer, an organic insulating material having higher elasticity than an inorganic insulating material may be disposed in a grid form, such that the stretchability of the display device may be improved. Accordingly, even when external impact is applied to the display device, the external impact may be alleviated, or the transmission of the impact may be reduced due to the stretchability of the display device itself. Accordingly, the convenience and lifespan of the display device may be improved.

In such embodiments, the grid is disposed not only in the display area but also in the non-display area, such that a gate driving circuit disposed in the non-display area may also be robust against external impact. Accordingly, the lifespan and convenience of the display device may be further improved.

However, effects according to the embodiments of the disclosure are not limited to those exemplified above and various other effects are incorporated herein.

BRIEF DESCRIPTION OF THE DRAWINGS

The above and other features of embodiments of the disclosure will become more apparent by describing in detail embodiments thereof with reference to the attached drawings, in which.

DETAILED DESCRIPTION

Figure 1:
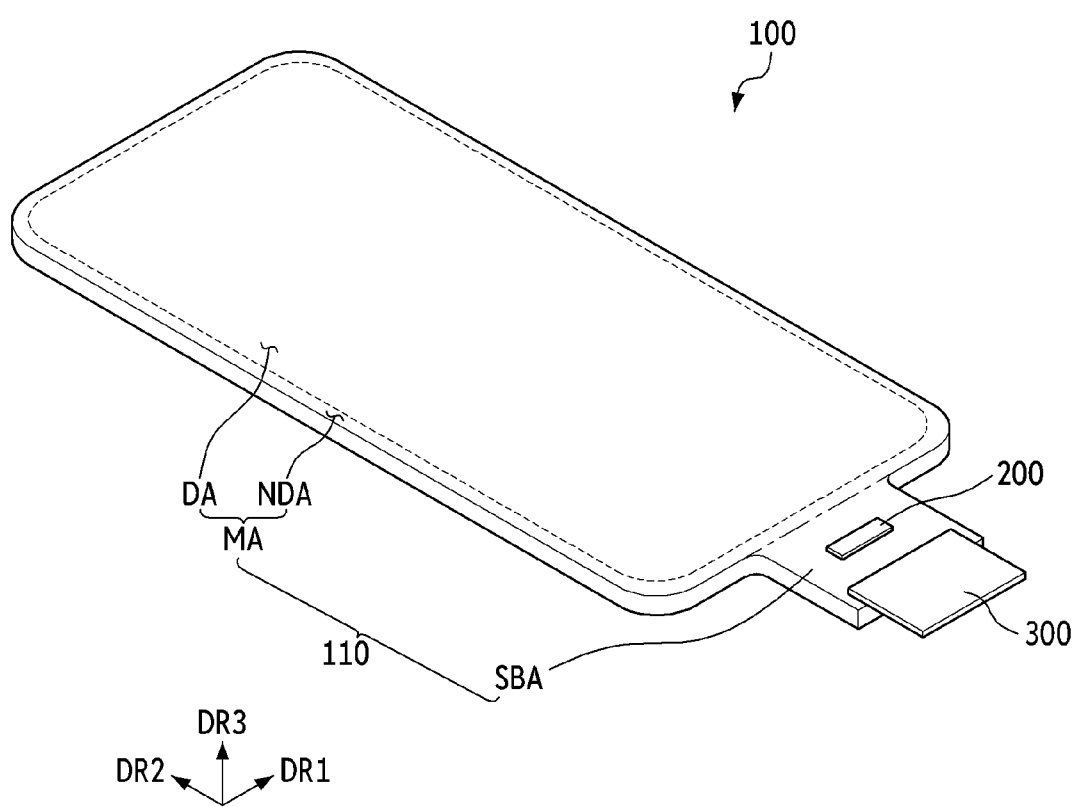
FIG. 1 is a perspective view illustrating a display device according to embodiments.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Some of the parts which are not associated with the description may not be provided for convenience of description.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an." "Or" means "and/or." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments will be described with reference to the accompanying drawings.

Figure 2:
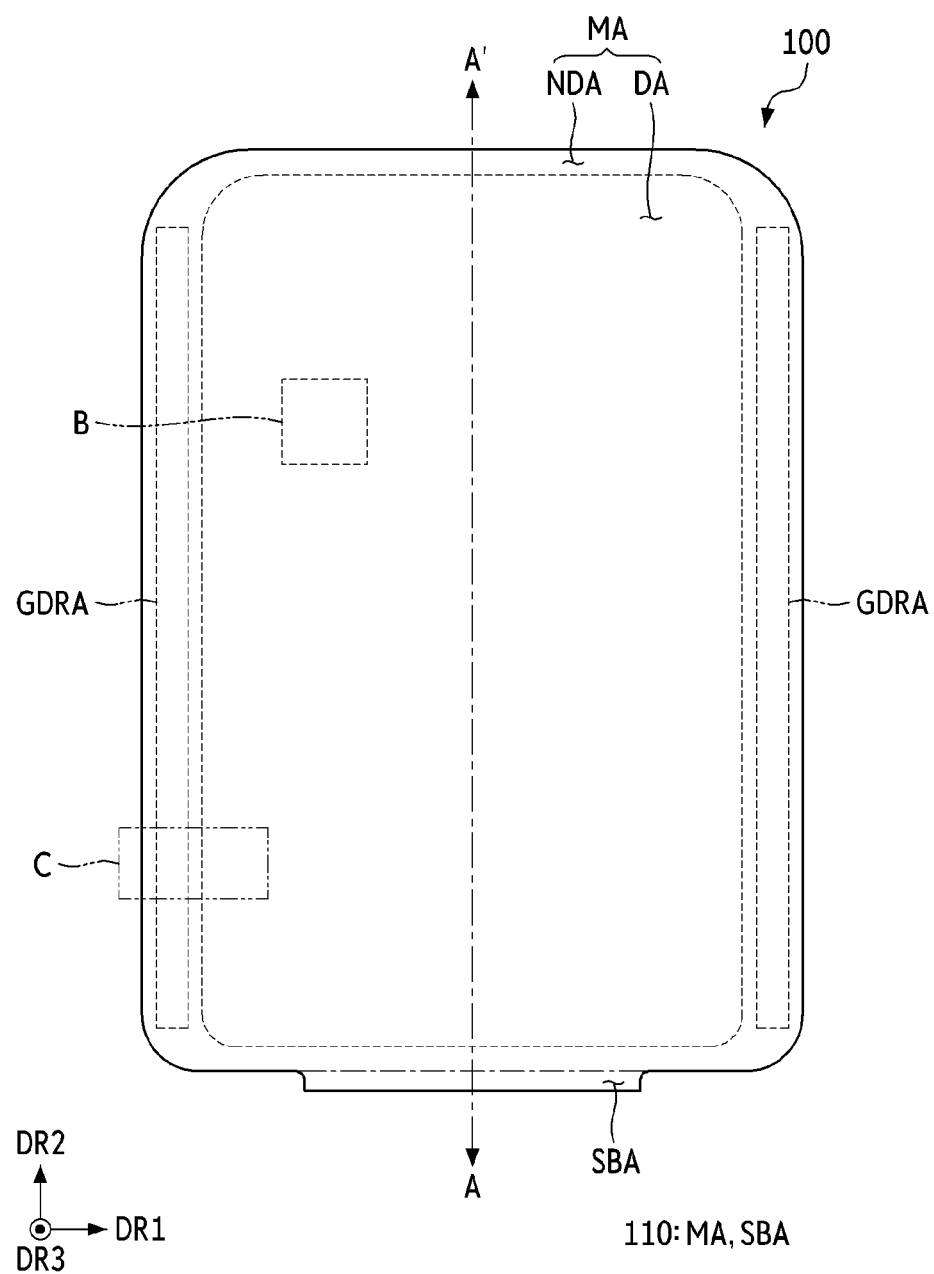
FIG. 2 is a plan view illustrating the display device of FIG. 1.
Figure 3:
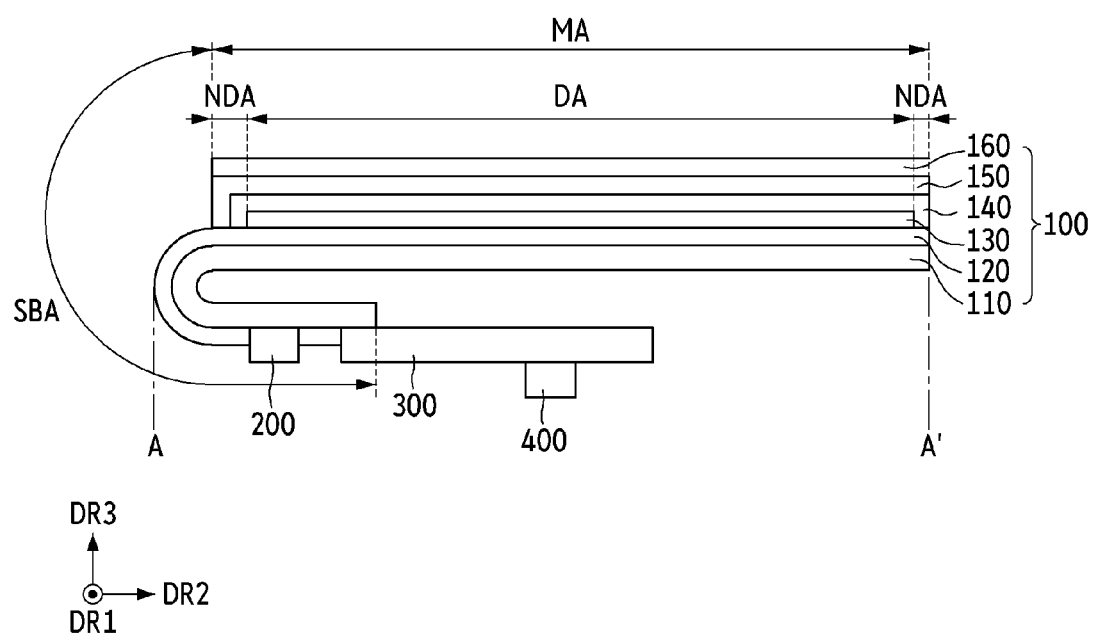
FIG. 3 is a cross-sectional view taken along line A-A' of FIG. 2.

FIG. 1 is a perspective view illustrating a display device according to embodiments. FIG. 2 is a plan view illustrating the display device of FIG. 1. FIG. 3 is a cross-sectional view taken along line A-A' of FIG. 2.

Referring to FIGS. 1 and 2, a display device 100 according to embodiments, which is a device for displaying a moving image or a still image, may be used as a display screen of various devices, such as a television, a laptop computer, a monitor, a billboard and an Internet-of-Things (IoT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 100 may be a light emitting display device such as an organic light emitting display including an organic light emitting diode, a quantum dot light emitting display including a quantum dot light emitting layer, an inorganic light emitting display including an inorganic semiconductor, and a micro light emitting display including a micro or nano light emitting diode (LED). In the following description, embodiments where the display device 100 is an organic light emitting display device will be mainly described. However, the disclosure is not limited thereto, and may be applied to a display device including an organic insulating material, an organic light emitting material, and a metal material.

The display device 100 may be formed to be flat, but is not limited thereto. In an embodiment, for example, the display device 100 may include a curved portion formed at left and right ends and having a constant curvature or a varying curvature. In an embodiment, the display device 100 may be formed to be flexible such that the display device 100 can be curved, bent, folded, or rolled.

As illustrated in FIGS. 1, 2 and 3, the display device 100 according to embodiments may include a substrate 110.

The substrate 110 may include a main region MA corresponding to a display surface of the display device 100 and a sub-region SBA protruding from one side of the main region MA.

As shown in FIG. 2, the main region MA may include a display area DA disposed at most of a center area thereof, and a non-display area NDA disposed in a peripheral area thereof around the display area DA.

The display area DA may, in a plan view (or when viewed in a third direction DR3), be formed in a rectangular shape having short sides extending in a first direction DR1 and long sides extending in a second direction DR2 intersecting the first direction DR1. Here, the third direction DR3 may be a direction perpendicular to the first direction and the second direction or a thickness direction of the display device 100 or the substrate 110. The corner where the short side in the first direction DR1 and the long side in the second direction DR2 meet may be rounded to have a predetermined curvature or may be right-angled. The planar shape of the display area DA is not limited to the rectangular shape, and may be formed in another polygonal shape, a circular shape or an elliptical shape.

The non-display area NDA may be disposed at the edge of the main region MA to surround the display area DA.

The sub-region SBA may be a region protruding or expanding from the non-display area NDA of the main region MA to one side in the second direction DR2.

The display device 100 may include a display driving circuit 200 disposed in the sub-region SBA and a display circuit board 300 bonded to one side of the sub-region SBA. FIGS. 2 and 3 illustrate an embodiment of the display device 100 where a part of the sub-region SBA is in a bent state.

As shown in FIGS. 2 and 3, a part of the sub-region SBA is transformed to be curved, such that another part of the sub-region SBA may be disposed on the rear surface of the display device 100.

Referring to FIG. 3, the display device 100 according to embodiments includes the substrate 110, a circuit layer 120 disposed on the substrate 110, and an element layer 130 disposed on the circuit layer 120.

The display device 100 according to embodiments may further include an encapsulation layer 140 disposed on the element layer 130, and a touch sensor layer 150 disposed on the encapsulation layer 140.

Also, the display device 100 according to embodiments may further include a polarization layer 160 disposed on the touch sensor layer 150 to reduce reflection of external light.

The substrate 110 may include or be formed of an insulating material such as a polymer resin. In an embodiment, for example, the substrate 110 may be formed of polyimide. The substrate 110 may be a flexible substrate which can be bent, folded or rolled.

Alternatively, the substrate 110 may include or be formed of an insulating material such as glass or the like.

The substrate 110 may include the main region MA and the sub-region SBA. The main region MA may include the display area DA and the non-display area NDA.

The display device 100 may further include the display driving circuit 200 disposed in the sub-region SBA, the display circuit board 300 bonded to one side of the sub-region SBA, and a touch driving circuit 400 mounted on the display circuit board 300.

The display driving circuit 200 may supply a data signal Vdata (see FIG. 5) to data lines DL (see FIG. 5) of the circuit layer 120.

The display circuit board 300 may be connected to signal pads disposed at an edge of the sub-region SBA and may be electrically connected to the circuit layer 120 or the display driving circuit 200.

The touch driving circuit 400 may be electrically connected to the touch sensor layer 150.

The circuit layer 120 may include insulating layers, conductive layers, and one or more semiconductor layers. One or more insulating layers may be interposed between the conductive layers and one or more semiconductor layers. The circuit layer 120 may include transistors defined by or formed of one or more semiconductor layers and one or more conductive layers, and signal lines, each being defined by or formed of at least one of the conductive layers.

The element layer 130 may include light emitting elements.

The encapsulation layer 140 may cover the circuit layer 120 and the element layer 130, and may block permeation of oxygen or moisture into the element layer 130.

The touch sensor layer 150 may include touch electrodes and touch lines connected to the touch electrodes.

The touch driving circuit 400 may apply a touch driving signal to driving lines of the touch sensor layer 150, and receive a touch sensing signal from sensing lines. Further, the touch driving circuit 400 may detect charge variation amounts of capacitances based on the touch sensing signal, thereby determining whether a touch or approach of a user has occurred or approached. The touch of the user means that an object such as a pen or a user's finger is in direct contact with the top surface of the cover window disposed on the touch sensor layer. The approach of the user means that the object such as the pen or the user's finger hovers over an uppermost surface of the display device 110, e.g., a top surface of a cover window. The touch driving circuit 400 may output touch data including the user's touch coordinates to a main processor.

Figure 4:
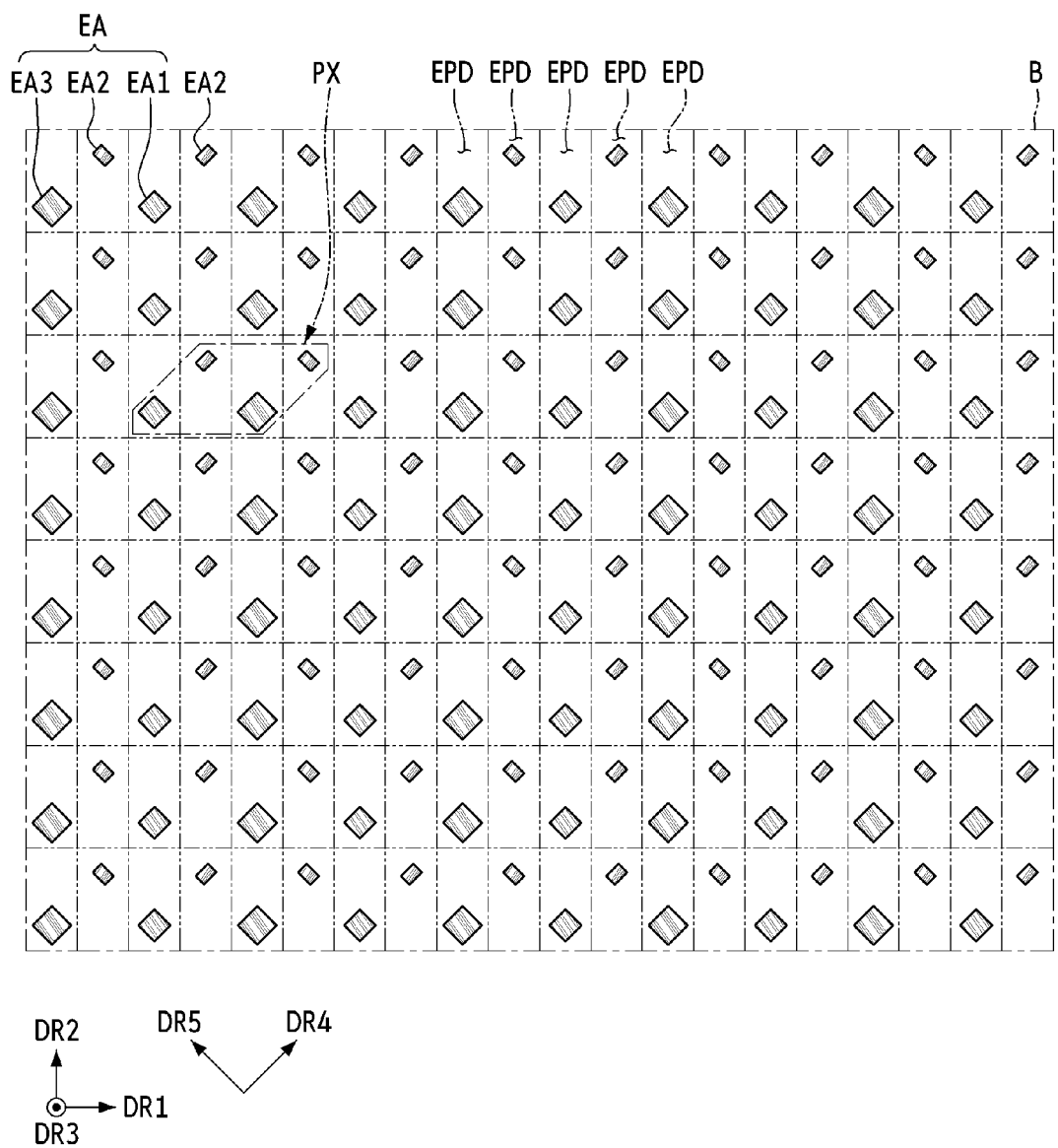
FIG. 4 is an enlarged plan view illustrating part B of FIG. 2.

FIG. 4 is an enlarged plan view illustrating part B of FIG. 2.

Referring to FIG. 4, the display area DA of the display device 100 according to embodiments may include the emission areas EA. In addition, the display area DA may further include a non-emission area disposed in a gap between the emission areas EA.

The element layer 130 (see FIG. 3) may include light emitting elements LE (see FIG. 5) respectively disposed in the emission areas EA.

The circuit layer 120 (see FIG. 3) may include light emitting pixel drivers EPD arranged side by side in the first direction DR1 and the second direction DR2 in the main region MA. The light emitting pixel drivers EPD may be respectively electrically connected to the light emitting elements LE (see FIG. 5) of the element layer 130.

In an embodiment, the emission areas EA may have a rhombus shape or a rectangular shape in a plan view.

However, this is only an example, and the planar shape of the emission areas EA according to embodiments is not limited to that illustrated in FIG. 4. In another embodiment, in a plan view, the emission areas EA may have a polygonal shape such as a square, a pentagon, a hexagon, etc., or may have a circular or elliptical shape including an edge of a curve.

The emission areas EA may include first emission areas EA1 for emitting light of a first color in a predetermined wavelength band, second emission areas EA2 for emitting light of a second color in a wavelength band lower than that of the first color, and third emission areas EA3 for emitting light of a third color in a wavelength band lower than that of the second color.

For example, the first color may be red having a wavelength band of about 600 nanometers (nm) to about 750 nm. The second color may be green having a wavelength band of about 480 nm to about 560 nm. The third color may be blue having a wavelength band of about 370 nm to about 460 nm.

The first emission areas EA1 and the third emission areas EA3 may be alternately disposed in at least one of the first direction DR1 or the second direction DR2.

The second emission areas EA2 may be arranged side by side with each other in at least one of the first direction DR1 or the second direction DR2.

In addition, the second emission areas EA2 may be adjacent to the first emission areas EA1 and the third emission areas EA3 in diagonal directions DR4 and DR5 intersecting the first direction DR1 and the second direction DR2.

Pixels PX for displaying their own luminances and colors may be provided by the first emission area EA1, the second emission area EA2, and the third emission area EA3 adjacent to each other among these emission areas EA.

In other words, the pixels PX may be a basic unit for displaying various colors including white with a predetermined luminance.

Each of the pixels PX may include at least one first emission area EA1, at least one second emission area EA2, and at least one third emission area EA3 that are adjacent to each other. Accordingly, each of the pixels PX may display various colors through a mixture of the light emitted from the first emission area EA1, the second emission area EA2, and the third emission area EA3 that are adjacent to each other.

Figure 5:
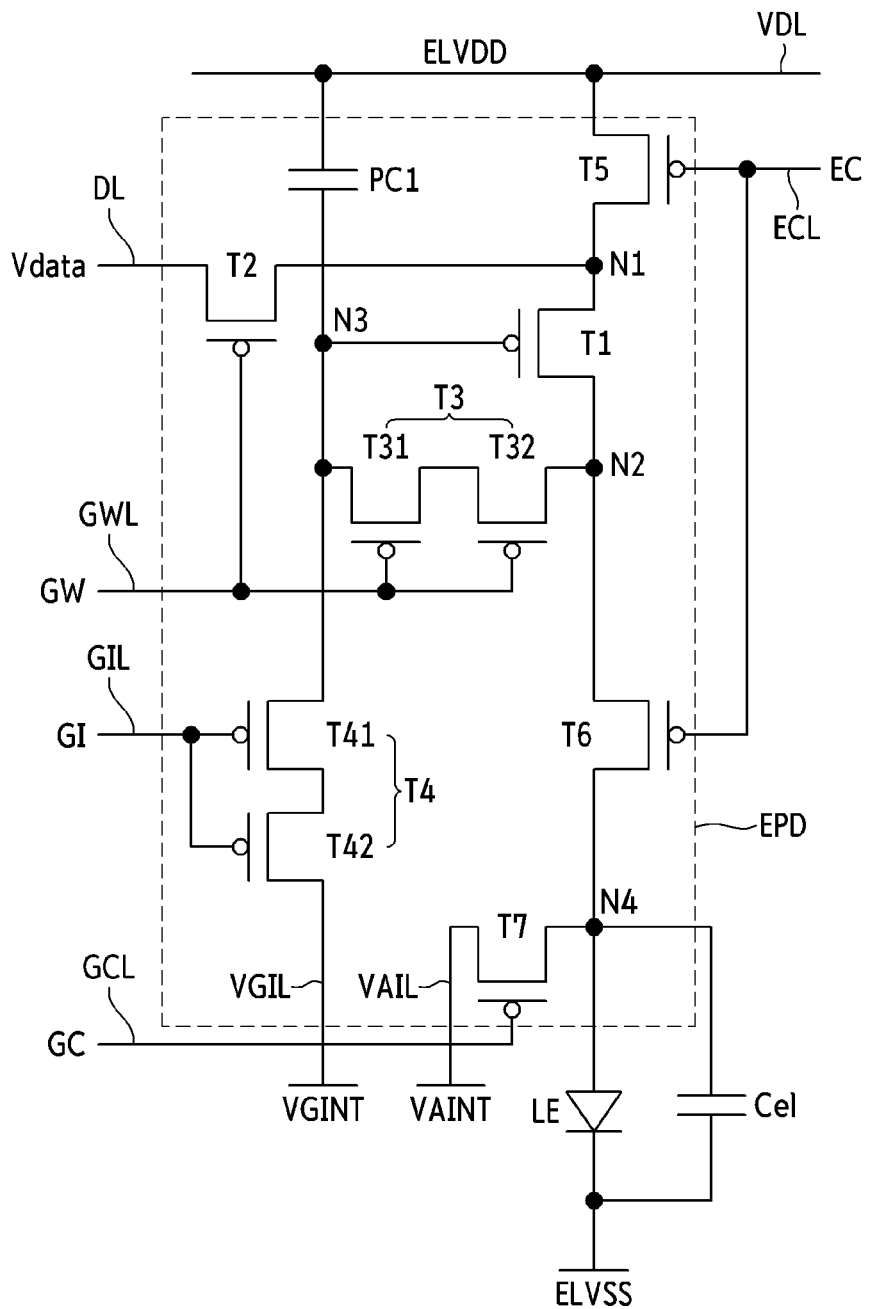
FIG. 5 is an equivalent circuit diagram showing the light emitting pixel driver of FIG. 4 according to an embodiment.

FIG. 5 is an equivalent circuit diagram showing the light emitting pixel driver of FIG. 4 according to an embodiment.

Referring to FIG. 5, in an embodiment, the light emitting pixel drivers EPD of the circuit layer 120 may be electrically connected between a first power ELVDD and the light emitting elements LE of the element layer 130.

One of the light emitting elements LE of the element layer 130 may be electrically connected between one of the light emitting pixel drivers EPD of the circuit layer 120 and a second power ELVSS.

That is, the anode electrode of the light emitting element LE is electrically connected to the light emitting pixel driver EPD, and the cathode electrode of the light emitting element LE may be applied with the second power ELVSS lower than the first power ELVDD.

In FIG. 5, a capacitor Cel connected in parallel with the light emitting element LE refers to a parasitic capacitance between the anode electrode and the cathode electrode.

The circuit layer 120 may include a first power line VDL for transmitting the first power ELVDD, a gate initialization voltage line VGIL for transmitting a gate initialization voltage VGINT, and an anode initialization voltage line VAIL for transmitting an anode initialization voltage VAINT.

The circuit layer 120 may include gate lines GL electrically connected to at least one gate electrode of transistors T1 to T7 provided in each of the light emitting pixel drivers EPD.

The gate lines GL may include a scan write line GWL for transmitting a scan write signal GW, a scan initialization line GIL for transmitting a scan initialization signal GI, an emission control line ECL for transmitting an emission control signal EC, and a gate control line GCL for transmitting a gate control signal GC.

One light emitting pixel driver EPD of the circuit layer 120 may include a first transistor T1 that generates a driving current for driving the light emitting element LE, two or more transistors T2 to T7 electrically connected to the first transistor T1, and at least one pixel capacitor PC1.

The first transistor T1 may be electrically connected between a first node N1 and a second node N2. The first node N1 is electrically connected to the first electrode (e.g., source electrode) of the first transistor T1. The second node N2 is electrically connected to the second electrode (e.g., drain electrode) of the first transistor T1.

The first node N1 may be electrically connected to the first power line VDL through the fifth transistor T5.

The second node N2 may be electrically connected to the anode electrode of the light emitting element LE through the sixth transistor T6.

The pixel capacitor PC1 may be electrically connected between the first power line VDL and a third node N3. The third node N3 is electrically connected to the gate electrode of the first transistor T1.

That is, the gate electrode of the first transistor T1 may be electrically connected to the first power line VDL through the pixel capacitor PC1.

Accordingly, the potential of the gate electrode of the first transistor T1 may be maintained at the voltage charged in the pixel capacitor PC1.

The second transistor T2 may be electrically connected between the data line DL and the first node N1.

The second transistor T2 may be electrically connected between the first electrode of the first transistor T1 and the data line DL.

That is, the first electrode of the first transistor T1 may be electrically connected to the data line DL through the second transistor T2.

The second transistor T2 may be turned on by the scan write signal GW of the scan write line GWL.

The fifth transistor T5 may be electrically connected between the first node N1 and the first power line VDL.

The sixth transistor T6 may be electrically connected between the second node N2 and the fourth node N4. The fourth node N4 is electrically connected to the anode electrode of the light emitting element LE.

That is, the fifth transistor T5 may be electrically connected between the first electrode of the first transistor T1 and the first power line VDL.

The sixth transistor T6 may be electrically connected between the second electrode of the first transistor T1 and the anode electrode of the light emitting element LE.

The fifth transistor T5 and the sixth transistor T6 may be turned on by the emission control signal EC of the emission control line ECL.

When the data signal Vdata of the data line DL is transmitted to the first electrode of the first transistor T1 through the turned-on second transistor T2, the voltage difference between the gate electrode of the first transistor T1 and the first electrode of the first transistor T1 may be a difference voltage between the first power ELVDD and the data signal Vdata.

In this case, when the voltage difference between the gate electrode of the first transistor T1 and the first electrode of the first transistor T1, i.e., the gate-source voltage difference becomes equal to or greater than a threshold voltage, the first transistor T1 may be turned on, thereby generating a drain-source current of the first transistor T1 corresponding to the data signal Vdata.

Subsequently, when the fifth transistor T5 and the sixth transistor T6 are turned on, the first power ELVDD, the first transistor T1, the light emitting element LE, and the second power ELVSS may be connected in series. Accordingly, the drain-source current of the first transistor T1 corresponding to the data signal Vdata may be supplied as a driving current of the light emitting element LE.

Accordingly, the light emitting element LE may emit light having a luminance corresponding to the data signal Vdata.

The third transistor T3 may be electrically connected between the second node N2 and the third node N3. That is, the third transistor T3 may be electrically connected between the gate electrode of the first transistor T1 and the second electrode of the first transistor T1.

The third transistor T3 may include a plurality of sub-transistors connected in series. In an embodiment, for example, the third transistor T3 may include a first sub-transistor T31 and a second sub-transistor T32.

The first electrode of the first sub-transistor T31 may be connected to the gate electrode of the first transistor T1, the second electrode of the first sub-transistor T31 may be connected to the first electrode of the second sub-transistor T32, and the second electrode of the second sub-transistor T32 may be connected to the second electrode of the first transistor T1.

In such an embodiment, the potential of the gate electrode of the first transistor T1 may be effectively prevented from changing due to the leakage current caused by the third transistor T3 that is not turned on.

The first sub-transistor T31 and the second sub-transistor T32 may be turned on by the scan write signal GW of the scan write line GWL.

When the first sub-transistor T31 and the second sub-transistor T32 are turned on, the voltage difference between the second node N2 and the third node N3 may be initialized.

The fourth transistor T4 may be electrically connected between the gate initialization voltage line VGIL and the third node N3. That is, the fourth transistor T4 may be connected between the gate electrode of the first transistor T1 and the gate initialization voltage line VGIL.

The fourth transistor T4 may include a plurality of sub-transistors connected in series. In an embodiment, for example, the fourth transistor T4 may include a third sub-transistor T41 and a fourth sub-transistor T42.

The first electrode of the third sub-transistor T41 may be connected to the gate electrode of the first transistor T1, the second electrode of the third sub-transistor T41 may be connected to the first electrode of the fourth sub-transistor T42, and the second electrode of the fourth sub-transistor T42 may be connected to the gate initialization voltage line VGIL.

In such an embodiment, the potential of the gate electrode of the first transistor T1 may be effectively prevented from changing due to the leakage current caused by the fourth transistor T4 that is not turned on.

The third sub-transistor T41 and the fourth sub-transistor T42 may be turned on by the scan initialization signal GI of the scan initialization line GIL.

When the third sub-transistor T41 and the fourth sub-transistor T42 are turned on, the potential of the third node N3 may be initialized to the gate initialization voltage VGINT.

The seventh transistor T7 may be electrically connected between the fourth node N4 and the anode initialization voltage line VAIL. That is, the seventh transistor T7 may be electrically connected between the anode electrode of the light emitting element LE and the anode initialization voltage line VAIL.

The seventh transistor T7 may be turned on by the gate control signal GC of the gate control line GCL.

Through the turned-on seventh transistor T7, the potential of the fourth node N4 may be initialized to the anode initialization voltage VAINT.

As shown in FIG. 5, according to an embodiment, the first to seventh transistors T1 to T7 may be provided as P-type metal-oxide-semiconductor field-effect transistors (MOSFETs).

Figure 6:
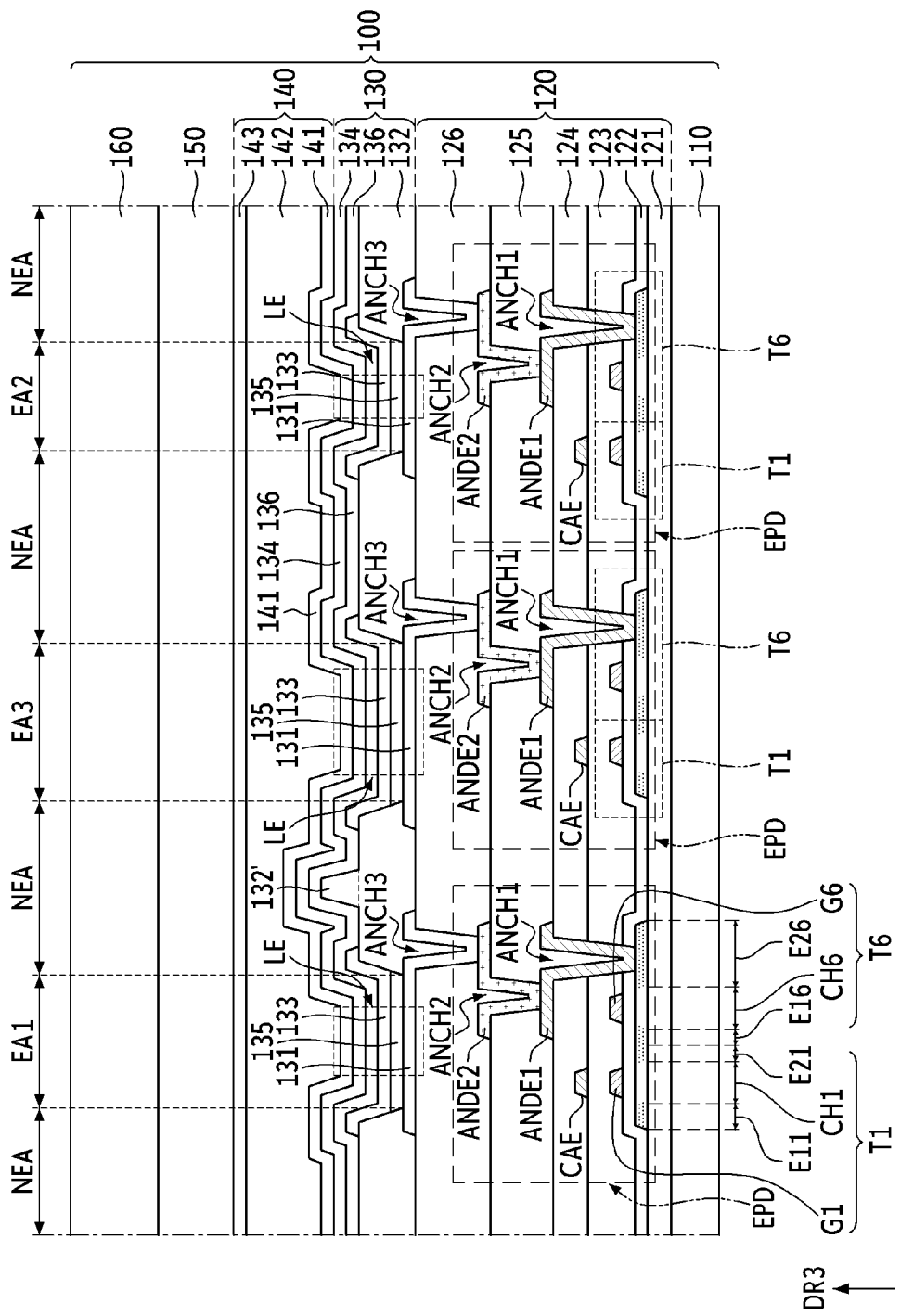
FIG. 6 is a cross-sectional view showing the light emitting element and the first and sixth transistors of FIG. 5.

FIG. 6 is a cross-sectional view showing the light emitting element and the first and sixth transistors of FIG. 5.

Referring to FIG. 6, the display device 100 according to embodiments may include the substrate 110, the circuit layer 120 on the substrate 110, and the element layer 130 on the circuit layer 120.

The display panel 100 of the display device 100 according to embodiments may further include the encapsulation layer 140 on the element layer 130, the touch sensor layer 150 on the encapsulation layer 140, and the polarization layer 160 on the touch sensor layer 150.

According to an embodiment, the circuit layer 120 may include a substrate buffer layer 121 disposed on the substrate 110, a semiconductor layer CH1, E11, E21, CH6, E16, and E26 disposed on the substrate buffer layer 121, a first gate insulating layer 122 covering the semiconductor layer, a first gate conductive layer G1 and G6 disposed on the first gate insulating layer 122, a second gate insulating layer 123 covering the first gate conductive layer, a second gate conductive layer CAE disposed on the second gate insulating layer 123, and an interlayer insulating layer 124 covering the second gate conductive layer CAE.

In addition, the circuit layer 120 may further include a first source-drain conductive layer ANCE1 disposed on the interlayer insulating layer 124, a first planarization layer 125 covering the first source-drain conductive layer, a second source-drain conductive layer DL and ANCE2 disposed on the first planarization layer 125, and a second planarization layer 126 covering the second source-drain conductive layer.

The circuit layer 120 may include the light emitting pixel drivers EPD respectively corresponding to the emission areas EA.

Each of the light emitting pixel drivers EPD may include the first transistor T1, the second to seventh transistors T2 to T7 (see FIG. 5) electrically connected to the first transistor T1, and at least one pixel capacitor PC1 (see FIG. 5).

The channel portion, the first electrode portion, and the second electrode portion of each of the P-type MOSFETs may be disposed in a semiconductor layer on the substrate buffer layer 121.

That is, channel portions CH1 and CH6, first electrode portions E11 and E16, and second electrode portions E21 and E26 of each of the first to seventh transistors T1 to T7 may be disposed in (or defined by portions of) a semiconductor layer on the substrate buffer layer 121.

In each of the first transistor T1 and the sixth transistor T6, the first electrode portions E11 and E16 may be connected to one ends of the channel portions CH1 and CH6, and the second electrode portions E21 and E26 may be connected to the other ends of the channel portions CH1 and CH6.

The second electrode portion E21 of the first transistor T1 may be connected to the first electrode portion E16 of the sixth transistor T6.

The gate electrode of each of the P-type MOSFETs may be disposed in the first gate conductive layer on the first gate insulating layer 122.

That is, gate electrodes G1 and G6 of the first to seventh transistors T1 to T7 may be disposed in or defined by the first gate conductive layer on the first gate insulating layer 122.

In the first transistor T1 and the sixth transistor T6, the gate electrodes G1 and G6 may overlap the channel portions CH1 and CH6, respectively.

In the light emitting pixel driver EPD of FIG. 5, the second transistor T2, the first sub-transistor T31, the second sub-transistor T32, the third sub-transistor T41, the fourth sub-transistor T42, and the fifth transistor T5 and the seventh transistor T7 are provided as the same P-type MOSFETs as the first transistor T1 and the sixth transistor T6, an any repetitive detailed description thereof will be omitted or simplified.

A capacitor electrode CAE for the pixel capacitor PC1 (see FIG. 5) may be disposed in or defined by the second gate conductive layer on the second gate insulating layer 123.

The capacitor electrode CAE may overlap the gate electrode G1 of the first transistor T1.

Accordingly, the pixel capacitor PC1 (see FIG. 5) may be provided or defined by the overlapping area between the capacitor electrode CAE and the gate electrode G1 of the first transistor T1.

The first source-drain conductive layer on the interlayer insulating layer 124 may include a first anode connection electrode ANCE1.

The first anode connection electrode ANCE1 may be electrically connected to the second electrode portion E26 of the sixth transistor T6 through a first anode connection hole ANCH1.

The second source-drain conductive layer on the first planarization layer 128 may include a second anode connection electrode ANCE2.

The second anode connection electrode ANCE2 may be electrically connected to the first anode connection electrode ANCE1 through a second anode connection hole ANCH2.

The anode electrode 131 of the element layer 130 may be disposed on the second planarization layer 126, and may be electrically connected to the second anode connection electrode ANCE2 through a third anode connection hole ANCH3.

Accordingly, the anode electrode 131 may be electrically connected to the second electrode portion E26 of the sixth transistor T6 through the first anode connection electrode ANCE1 and the second anode connection electrode ANCE2.

The element layer 130 on the circuit layer 120 may include the light emitting elements LE respectively disposed in the emission areas EA1, EA2, and EA3.

Each of the light emitting elements LE may include a structure in which a light emitting layer 133 is disposed between the anode electrode 131 and a cathode electrode 134 facing each other.

In accordance with embodiments, the element layer 130 may include the anode electrodes 131 respectively disposed in the emission areas EA, a pixel defining layer 132 disposed in the non-emission area NEA and covering an edge portion of the anode electrode 131, a spacer layer 132' disposed on a part of the pixel defining layer 132, the light emitting layers 133 respectively disposed on the anode electrodes 131, and the cathode electrode 134 disposed on the light emitting layers 133, the pixel defining layer 132, and the spacer layer 132'.

Each of the light emitting elements LE may further include first common layers disposed between the anode electrodes 131 and the light emitting layers 133, and a second common layer disposed between the light emitting layers 133 and the cathode electrode 134.

The encapsulation layer 140 may be disposed on the circuit layer 120 and cover the element layer 130.

The encapsulation layer 140 may be provided to block the permeation of oxygen or moisture into the element layer 130 and to reduce electrical or physical impact to the circuit layer 120 and the element layer 130.

The encapsulation layer 140 may include a first encapsulation layer 141 disposed on the element layer 130 and including an inorganic insulating material, a second encapsulation layer 142 disposed on the first encapsulation layer 141 and including an organic insulating material, and a third encapsulation layer 143 covering the second encapsulation layer 142 and including an inorganic insulating material.

The touch sensor layer 150 may be disposed on the encapsulation layer 140.

The polarization layer 160 may be disposed on the touch sensor layer 150.

Figure 7:
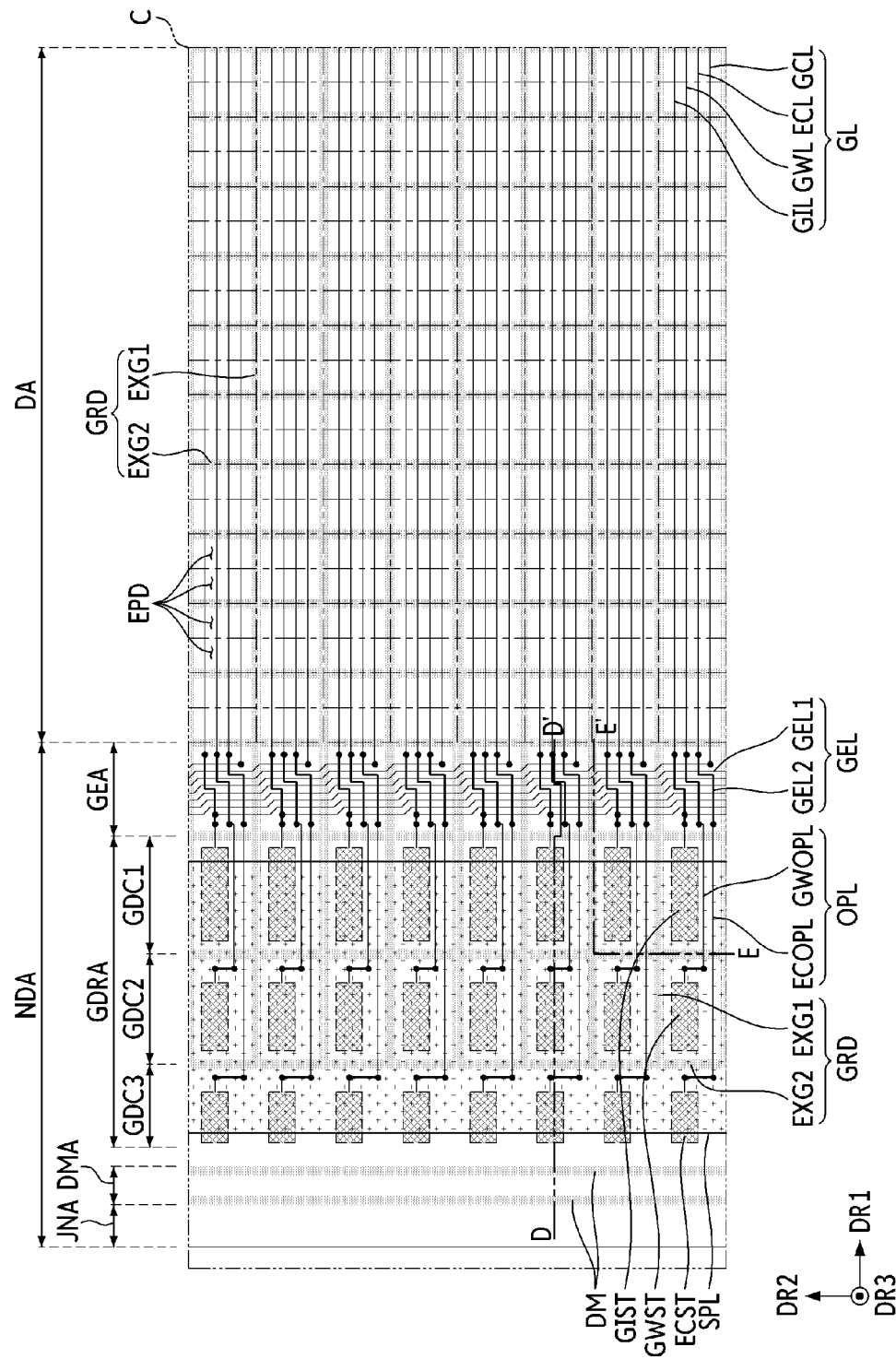
FIG. 7 is a plan view illustrating part C of FIG. 2 according to embodiments.

FIG. 7 is a plan view illustrating part C of FIG. 2 according to embodiments.

Referring to FIG. 7, the circuit layer 120 (see FIG. 3) of the display device 100 according to embodiments includes the light emitting pixel drivers EPD electrically connected to the light emitting elements LE (see FIG. 6) of the element layer 130 (see FIG. 3), respectively, gate lines GL (GIL, GWL, ECL and GCL) for transmitting a gate signal GI, GW, EC, and GC (see FIG. 5) to the light emitting pixel drivers EPD, a gate driving circuit that includes stages GIST, GWST, and ECST disposed in a gate driving area GDRA of the non-display area NDA and electrically connected to the gate lines GL, respectively, and a grid GRD formed in the display area DA and the non-display area NDA.

According to embodiments, the non-display area NDA may include the gate driving area GDRA in which the gate driving circuit is disposed, an extension line area GEA disposed between the gate driving area GDRA and the display area DA, a dam area DMA surrounding the gate driving area GDRA and the display area DA, and a junction area JNA surrounding the dam area DMA.

In an embodiment, for example, the gate driving area GDRA may face at least one edge of the edges of the display area DA extending in the second direction DR2.

The gate driving area GDRA may include a first circuit area GDC1, a second circuit area GDC2, and a third circuit area GDC3.

In an embodiment, for example, as illustrated in FIG. 7, the first circuit area GDC1, the second circuit area GDC2, and the third circuit area GDC3 may be adjacent to each other (or sequentially arranged) in the first direction DR1.

In another embodiment, for example, the first circuit area GDC1 of the gate driving area GDRA may be disposed closest to one side of the display area DA, and the third circuit area GDC3 of the gate driving area GDRA may be disposed closest to a corresponding or adjacent edge of the substrate 110.

However, this is only an example, and some of the first circuit area GDC1, the second circuit area GDC2, and the third circuit area GDC3 may face one side of the display area DA, and some others may face some other sides of the display area DA.

At least one dam portion DM may be arranged in the dam area DMA.

The light emitting pixel drivers EPD may be arranged in a matrix from in the first direction DR1 and the second direction DR2 in the display area DA.

The gate lines GL may extend in the first direction DR1.

The gate lines GL may include scan write lines GWL for transmitting the scan write signal GW, scan initialization lines GIL for transmitting the scan initialization signal GI, emission control lines ECL for transmitting the emission control signal EC, and gate control lines GCL for transmitting the gate control signal GC.

The stages GIST, GWST, and ECST of the gate driving circuit may include initialization stages GIST arranged in the first circuit area GDC1 of the gate driving area GDRA, write stages GIST arranged in the second circuit area GDC2 of the gate driving area GDRA, and emission control stages ECST arranged in the third circuit area GDC3 of the gate driving area GDRA.

Each of the first circuit area GDC1, the second circuit area GDC2, and the third circuit area GDC3 may extend in the second direction DR2.

The first circuit area GDC1, the second circuit area GDC2, and the third circuit area GDC3 may be adjacent to each other in the first direction DR1.

The initialization stages GIST of the first circuit area GDC1 may be arranged side by side in the second direction DR2.

The initialization stages GIST may be electrically connected to the scan initialization lines GIL and the gate control lines GCL.

The write stages GIST of the second circuit area GDC2 may be arranged side by side in the second direction DR2.

The write stages GIST may be electrically connected to the scan write lines GWL.

The emission control stages ECST of the third circuit area GDC3 may be arranged side by side in the second direction DR2.

The emission control stages ECST may be electrically connected to the emission control lines ECL.

According to embodiments, the circuit layer 120 (see FIG. 3) may further include gate extension lines GEL disposed in the extension line area GEA.

The gate extension lines GEL may include first gate extension lines GEL1 and second gate extension lines GEL2 disposed in or defined by different conductive layers, that is, conductive layers disposed in different layers from each other.

The gate extension lines GEL may be electrically connected between the stages GIST, GWST, and ECST and the gate lines GL.

The output terminals of the stages GIST, GWST, and ECST may be electrically connected to the gate lines GL through the gate extension lines GEL, respectively.

Some output terminals of the stages GIST, GWST, and ECST, which are spaced apart from the extension line area GEA, may be electrically connected to the gate extension lines GEL through output lines OPL, respectively.

In an embodiment, for example, each of the stages GIST, GWST, and ECST may correspond to one pixel row constituted with or corresponding to the light emitting pixel drivers EPD arranged side by side in the first direction DR1.

The output terminal of one initialization stage GIST may be electrically connected to the scan initialization line GIL through one second gate extension line GEL2, disposed in one pixel row corresponding thereto, and may be electrically connected to the gate control line GCL disposed in the other pixel row through one first gate extension line GEL1.

The output terminal of one write stage GWST may be electrically connected to the scan write line GWL through a write output line GWOPL and the other second gate extension line GEL2, disposed in one pixel row corresponding thereto.

The write output line GWOPL may be disposed between the output terminal of the write stage GWST and the other second gate extension line GEL2.

In an embodiment, the second circuit area GDC2 may be adjacent to the extension line area GEA, and the write output line GWOPL may be omitted.

The output terminal of one emission control stage ECST may be electrically connected to the emission control line ECL through the emission control output line ECOPL and the other second gate extension line GEL2, disposed in one pixel row corresponding thereto.

The emission control output line ECOPL may be disposed between the output terminal of the emission control stage ECST and the other second gate extension line GEL2.

In an embodiment, the third circuit area GDC3 is adjacent to the extension line area GEA, and the emission control output line ECOPL may be omitted.

According to embodiments, the circuit layer 120 (see FIG. 3) may further include a supply line SPL disposed in the non-display area NDA and surrounding at least a part of the edge of the display area DA.

A portion of the supply line SPL may overlap the gate driving area GDRA.

That is, at least some of the stages GIST, GWST, and ECST may overlap the supply line SPL.

The supply line SPL may transmit one of the first power ELVDD (see FIG. 5), the second power ELVSS (see FIG. 5), the gate initialization voltage VGINT (see FIG. 5), and the anode initialization voltage VAINT (see FIG. 5).

The circuit layer 120 (see FIG. 3) may include one or more supply lines SPL that overlap the gate driving area GDRA.

According to embodiments, the circuit layer 120 (see FIG. 3) includes the grid GRD formed in the display area DA and the non-display area NDA.

The grid GRD may be formed in at least some of the boundaries between the light emitting pixel drivers EPD and at least some of the boundaries between the stages GIST, GWST, and ECST.

The grid GRD may be defined by grooves formed through portions of two or more insulating layers (the substrate buffer layer 121, the first gate insulating layer 122, the second gate insulating layer 123, and the interlayer insulating layer 124 in FIG. 6) disposed on the substrate 110 (see FIG. 6) and including an inorganic insulating material in the circuit layer 120 (see FIG. 6).

The grid GRD may include first extension grooves EXG1 and second extension grooves EXG2 that intersect the first extension grooves EXG1.

The first extension grooves EXG1 may have a straight line shape extending in the first direction DR1 in the plan view or when viewed in the third direction DR3.

The second extension grooves EXG2 may have a straight line shape extending in the second direction DR2 in the plan view or when viewed in the third direction DR3.

In the second direction DR2 in which the second extension grooves EXG2 extend, one or more light emitting pixel drivers EPD and one or more stages GIST, GWST, and ECST may be disposed between the first extension grooves EXG1.

That is, the first extension grooves EXG1 may be formed at the boundary of the light emitting pixel driver EPD at intervals of one or more light emitting pixel drivers EPD.

Alternatively, the first extension grooves EXG1 may be formed side by side to the boundaries of the stages GIST, GWST, and ECST, at intervals of one or more stages GIST, GWST, and ECST.

In the first direction DR1 in which the first extension grooves EXG1 extend, one or more light emitting pixel drivers EPD may be disposed between some of the second extension grooves EXG2 disposed in the display area DA among the second extension grooves EXG2.

That is, some of the second extension grooves EXG2 disposed in the display area DA may be formed at the boundary of the light emitting pixel driver EPD at intervals of one or more light emitting pixel drivers EPD.

In the first direction DR1, some others of the second extension grooves EXG2 disposed in the non-display area NDA among the second extension grooves EXG2 may be formed between the first circuit area GDC1, the second circuit area GDC2, and the third circuit area GDC3.

In the first direction DR1, two second extension grooves EXG2 of the second extension grooves EXG2 may be formed on opposing sides of the extension line area GEA, respectively.

Figure 8:
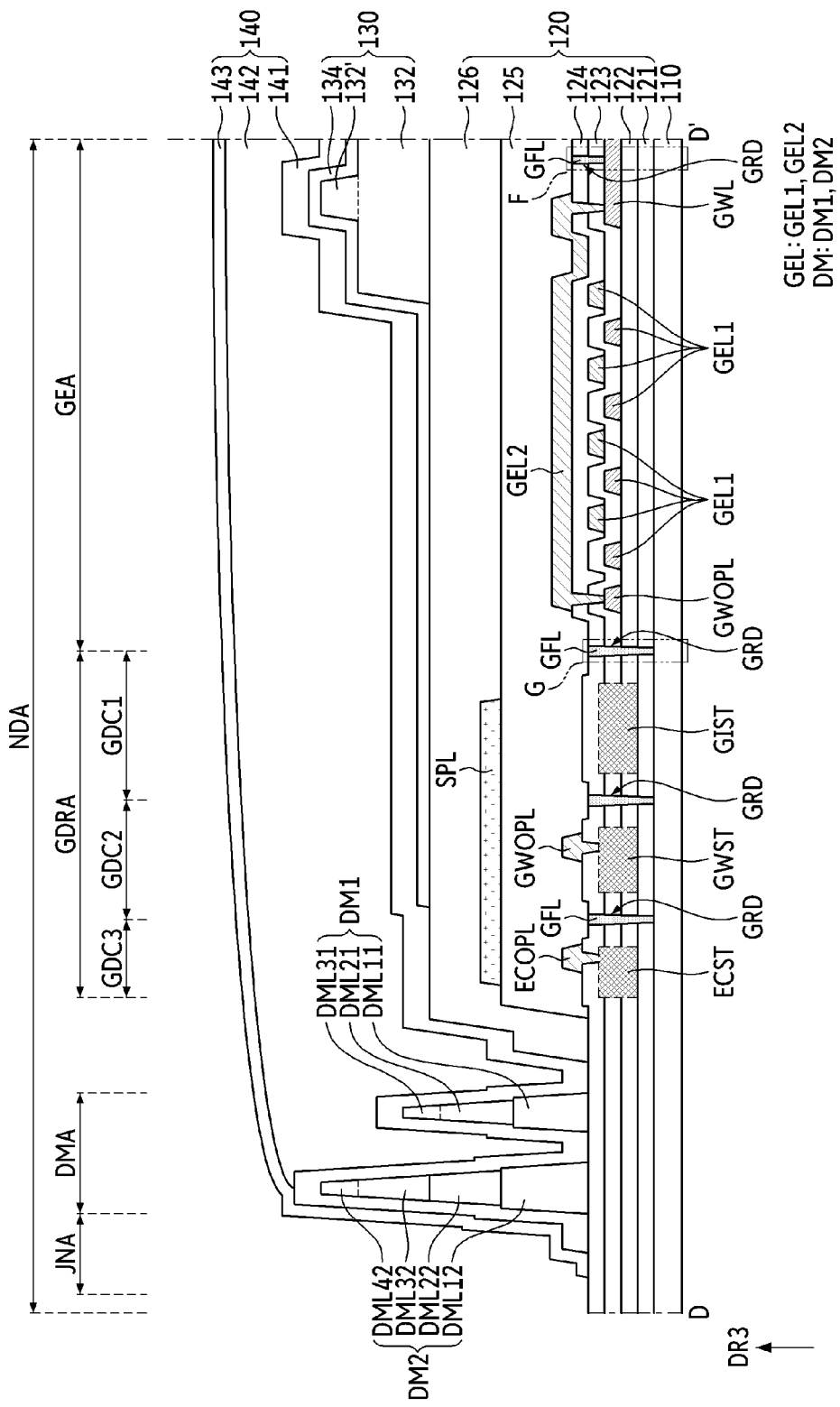
FIG. 8 is a cross-sectional view taken along line D-D' of FIG. 7 according to an embodiment.
Figure 9:
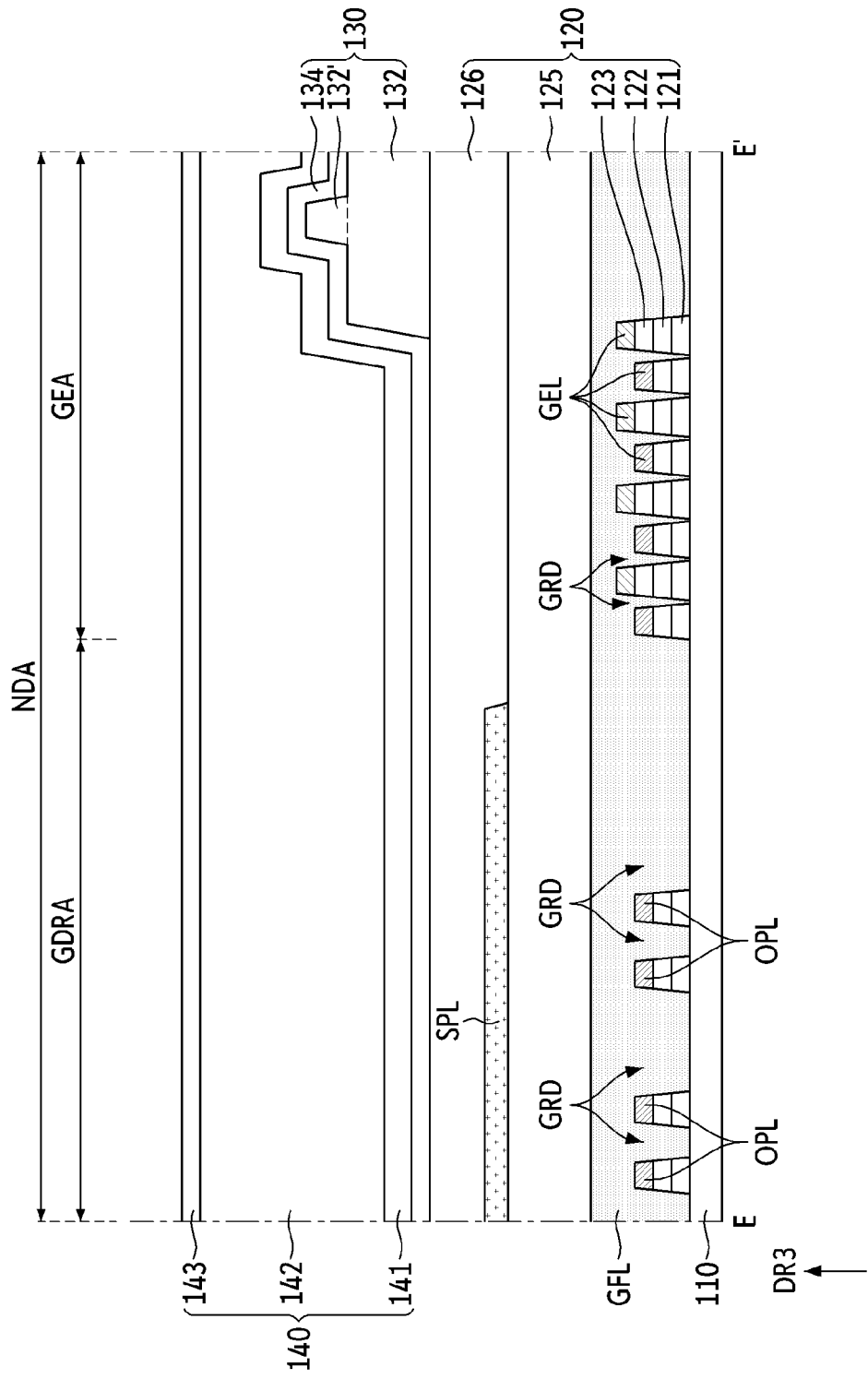
FIG. 9 is a cross-sectional view taken along line E-E' of FIG. 7 according to an embodiment.

FIG. 8 is a cross-sectional view taken along line D-D' of FIG. 7 according to an embodiment. FIG. 9 is a cross-sectional view taken along line E-E' of FIG. 7 according to an embodiment.

Referring to FIGS. 8 and 9, the circuit layer 120 of the display device 100 according to embodiments may include the grid GRD and a grid filling layer GFL that fills the grid GRD and includes an organic insulating material.

The grid GRD may be formed or defined through portions of each of two or more insulating layers including an inorganic insulating material, that is, the substrate buffer layer 121, the first gate insulating layer 122, the second gate insulating layer 123, and the interlayer insulating layer 124.

Accordingly, the grid GRD may reach or expose a part of each of the substrate 110, the first gate conductive layer on the first gate insulating layer 122, and the second gate conductive layer on the second gate insulating layer 123, that is, the grid filling layer GFL is in contact with the part of each of the substrate 110, the first gate conductive layer on the first gate insulating layer 122, and the second gate conductive layer on the second gate insulating layer 123.

That is, in the process of etching two or more insulating layers 121 to 124 to form the grid GRD, the first gate conductive layer and the second gate conductive layer may serve as an etch blocking layer.

That is, in the process of etching two or more insulating layers 121 to 124 to form the grid GRD, a part of each of the substrate buffer layer 121 and the first gate insulating layer 122 disposed below the first gate conductive layer may remain by the first gate conductive layer.

In addition, in the process of etching two or more insulating layers 121 to 124 to form the grid GRD, a part of each of the substrate buffer layer 121, the first gate insulating layer 122, and the second gate insulating layer 123 disposed below the second gate conductive layer may remain by the second gate conductive layer.

Accordingly, a portion of the grid GRD where the first gate conductive layer intersects may be in contact with (or expose) the first gate conductive layer, another portion where the second gate conductive layer intersects may be in contact with (or expose) the second gate conductive layer, and the remaining portion may be in contact with (or expose) the substrate 110.

Additionally, as described above, the grid GRD may be formed in at least some of the boundaries between the light emitting pixel drivers EPD and at least some of the boundaries between the stages GIST, GWST, and ECST.

Accordingly, the semiconductor layer CH1, E11, E21, CH6, CH16, and E26 (see FIG. 6) for providing the transistors T1 to T7 (see FIG. 5) of each of the light emitting pixel drivers EPD, and transistors of each of the stages GIST, GWST, and ECST may not be in contact with (or exposed by) the grid GRD.

That is, the grid GRD may be spaced apart from the semiconductor layer CH1, E11, E21, CH6, E16, and E26 (see FIG. 6) in the plan view.

According to embodiments, the circuit layer 120 may include the grid filling layer GFL that fills the grid GRD.

The grid filling layer GFL may include an organic insulating material.

In an embodiment, for example, the grid filling layer GFL may be provided together with the first planarization layer 125. In such an embodiment, the number of stacking processes may be reduced, and the manufacturing process of the display device 100 may be further simplified.

In another embodiment, for example, the grid filling layer GFL may be provided before the process of disposing the first source-drain conductive layer on the interlayer insulating layer 124, and the first planarization layer 125 may be provided after the process of disposing the source-drain conductive layer. In such an embodiment, since the first source-drain conductive layer may be disposed on the grid filling layer GFL, the disposition of the first source-drain conductive layer may be facilitated.

As described above, since the display device 100 according to embodiments includes the grid filling layer GFL that fills the grid GRD and includes an organic insulating material, and the organic insulating material has higher elasticity than the inorganic insulating material, deformation or damage to the display device 100 due to external impact may be reduced.

In addition, according to embodiments, the grid GRD is disposed not only in the display area DA but also in the gate driving area GDRA of the non-display area NDA, such that damage to the gate driving circuit due to external impact may be reduced.

Accordingly, in such an embodiment, the display device 100 may be robust against external impact, such that the convenience and lifespan of the display device 100 may be improved.

As illustrated in FIG. 8, each of the scan write line GWL and the first gate extension line GEL1 may be disposed in or defined by the first gate conductive layer on the first gate insulating layer 122 or the second gate conductive layer on the second gate insulating layer 123.

In an embodiment, for example, the first gate extension lines GEL1 may be alternately disposed in or defined by the first gate conductive layer on the first gate insulating layer 122 or the second gate conductive layer on the second gate insulating layer 123.

Each of the second gate extension lines GEL2 may be disposed in or defined by the first source-drain conductive layer on the interlayer insulating layer 124.

In each of the output lines ECOPL and GWOPL, a part may be disposed in or defined by the first source-drain conductive layer on the interlayer insulating layer 124, and other parts may be disposed in or defined by the first gate conductive layer on the first gate insulating layer 122 or the second gate conductive layer on the second gate insulating layer 123.

The supply line SPL may be disposed in the second source-drain conductive layer on the first planarization layer 125.

According to embodiments, at least one dam portion DM may be arranged in the dam area DMA.

At least one dam portion DM1 and DM2 is provided to limit the diffusion range of the organic insulating material of the second encapsulation layer 142 of the encapsulation layer 140.

Each of the at least one dam portion may include two or more dam layers DML11, DML21, DML31, DML12, DML22, DML32, and DML42.

Each of the two or more dam layers DML11, DML21, DML31, DML12, DML22, DML32, and DML42 may be disposed in (or directly on) a same layer as one of the first planarization layer 125, the second planarization layer 126, the pixel defining layer 132, and the spacer layer 132'.

In an embodiment, for example, the at least one dam portion DM may include a first dam portion DM1 surrounding the display area DA and a second dam portion DM2 surrounding the first dam portion DM1.

The first dam portion DM1 may include a first dam layer DML11 disposed in (or directly on) a same layer as the second planarization layer 126, a second dam layer DML21 disposed in (or directly on) a same layer as the pixel defining layer 132, and a third dam layer DML31 disposed in (or directly on) a same layer as the spacer layer 132'.

The second dam portion DM2 may include the first dam layer DML12 disposed in (or directly on) a same layer as the first planarization layer 125, the second dam layer DML22 disposed in (or directly on) a same layer as the second planarization layer 126, the third dam layer DML32 disposed in (or directly on) a same layer as the pixel defining layer 132, and the fourth dam layer DML42 disposed in (or directly on) a same layer as the spacer layer 132'.

In the junction area JNA, the first encapsulation layer 141 of the encapsulation layer 140 may be in contact with the interlayer insulating layer 124 of the circuit layer 120.

Further, the third encapsulation layer 143 may be in contact with the first encapsulation layer 141 or the interlayer insulating layer 124 in the junction area JNA.

Accordingly, a junction structure between the inorganic insulating materials may be provided in the junction area JNA.

Figure 10:
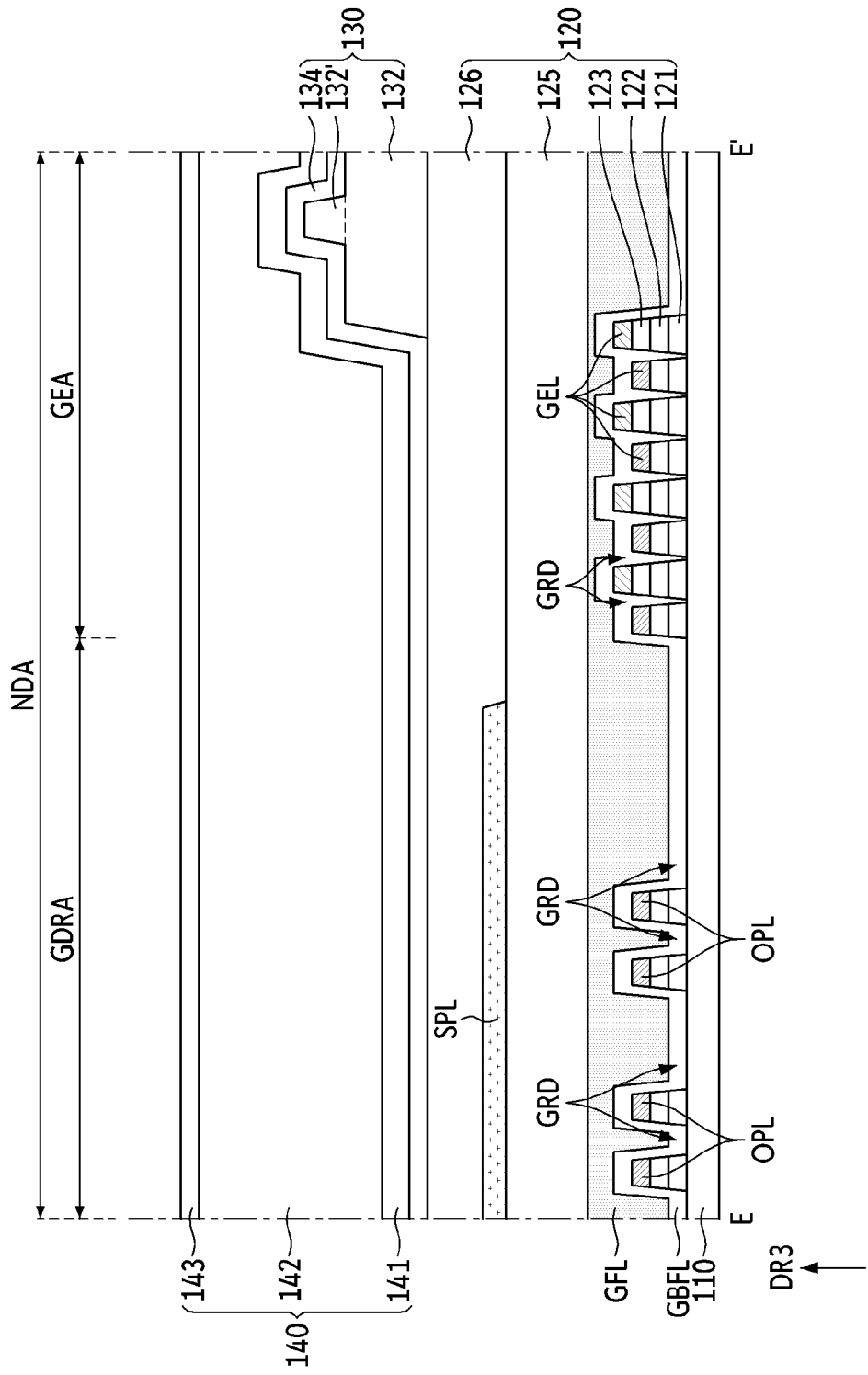
FIG. 10 is a cross-sectional view taken along line E-E' of FIG. 7 according to an embodiment.
Figure 11:
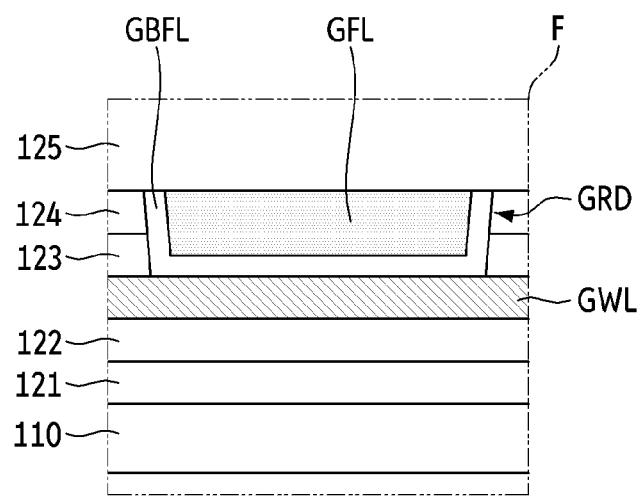
FIGS. 11 and 12 are enlarged views showing parts F and G of FIG. 8 according to an embodiment.
Figure 12:
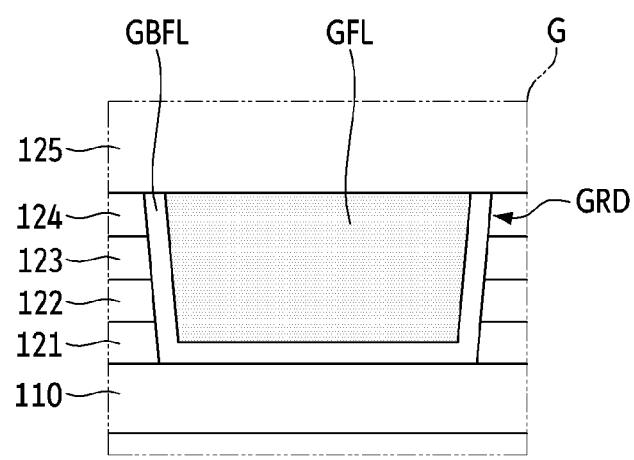

FIG. 10 is a cross-sectional view taken along line E-E' of FIG. 7 according to an embodiment. FIGS. 11 and 12 are enlarged views showing parts F and G of FIG. 8 according to an embodiment.

The display device 100 according to an embodiment illustrated in FIGS. 10, 11, and 12 is substantially the same as the display device 100 according to the embodiments illustrated in FIGS. 1 to 9 except that a grid buffer layer GBFL disposed between the grid GRD and the grid filling layer GFL is further included. Accordingly, any repetitive detailed description of the same or like elements as those described above will be omitted.

The grid buffer layer GBFL may cover a part of each of the substrate 110, the first gate conductive layer, and the second gate conductive layer exposed by the grid GRD, and a side surface of each of the substrate buffer layer 121, the first gate insulating layer 122, the second gate insulating layer 123, and the interlayer insulating layer 124.

The grid buffer layer GBFL may include an inorganic insulating material.

The grid filling layer GFL may be disposed on the grid buffer layer GBFL.

As described above, according to an embodiment, the grid buffer layer GBFL may be disposed between a portion of the substrate 110 exposed by the grid GRD and the grid filling layer GFL. Accordingly, oxygen or moisture that may permeate into the organic insulating material of the grid filling layer GFL through the substrate 110 may be blocked by the grid buffer layer GBFL. Accordingly, a decrease in the lifespan of the display device 100 due to the grid GRD and grid filling layer GFL may be effectively prevented.

Figure 13:
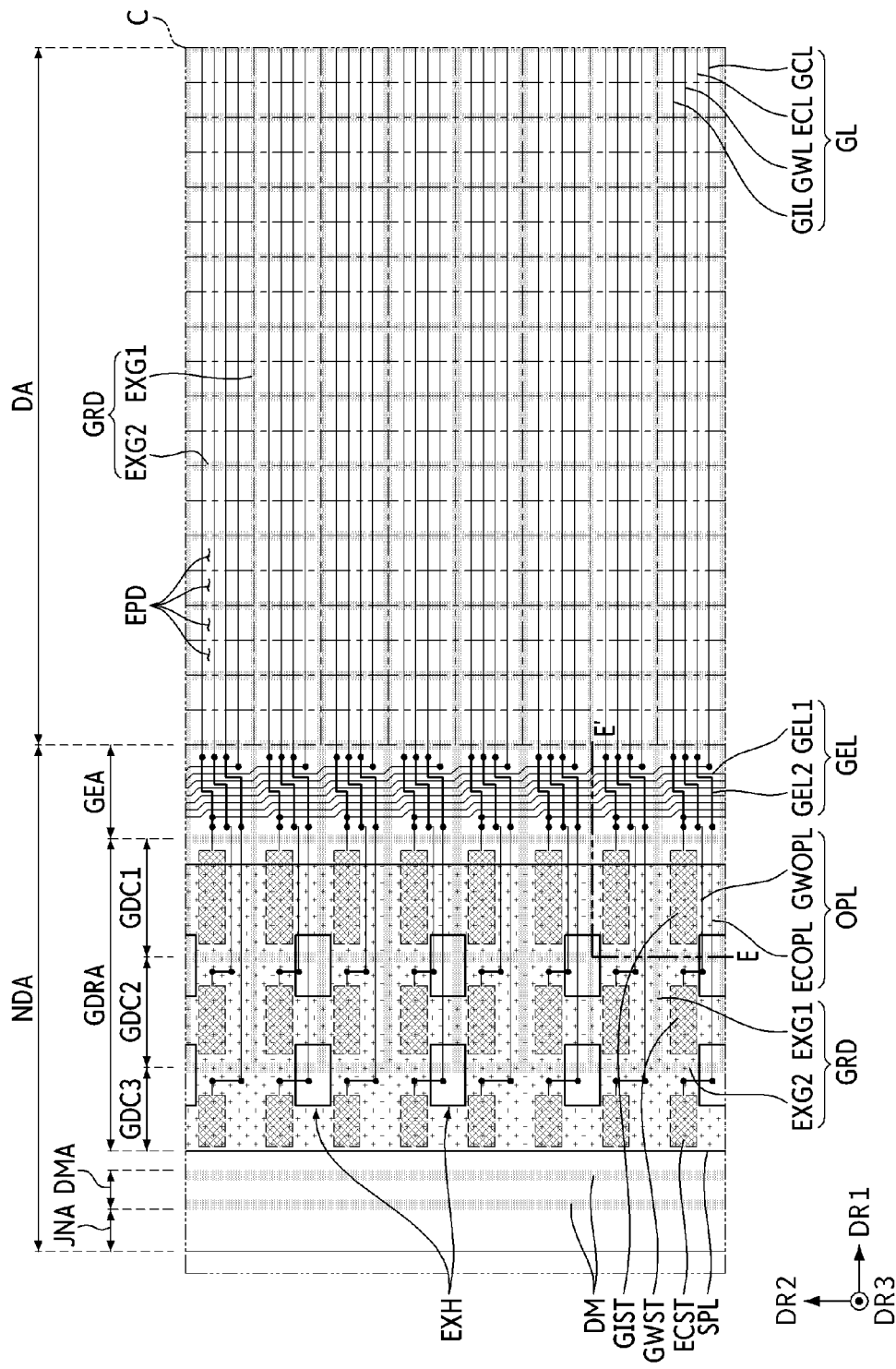
FIG. 13 is a plan view showing part C of FIG. 2 according to an embodiment.
Figure 14:
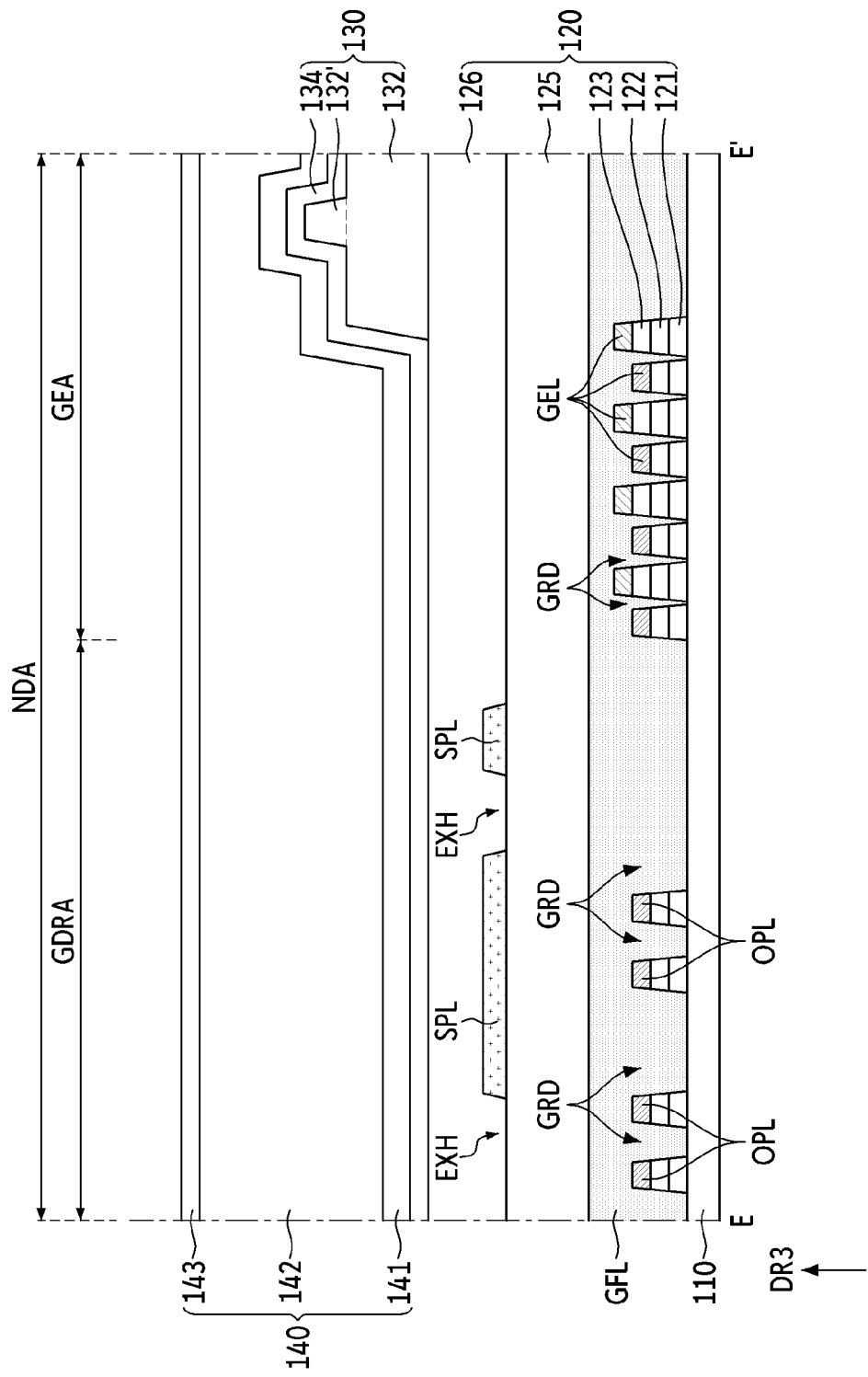
FIG. 14 is a cross-sectional view taken along line E-E' of FIG. 13.
Figure 15:
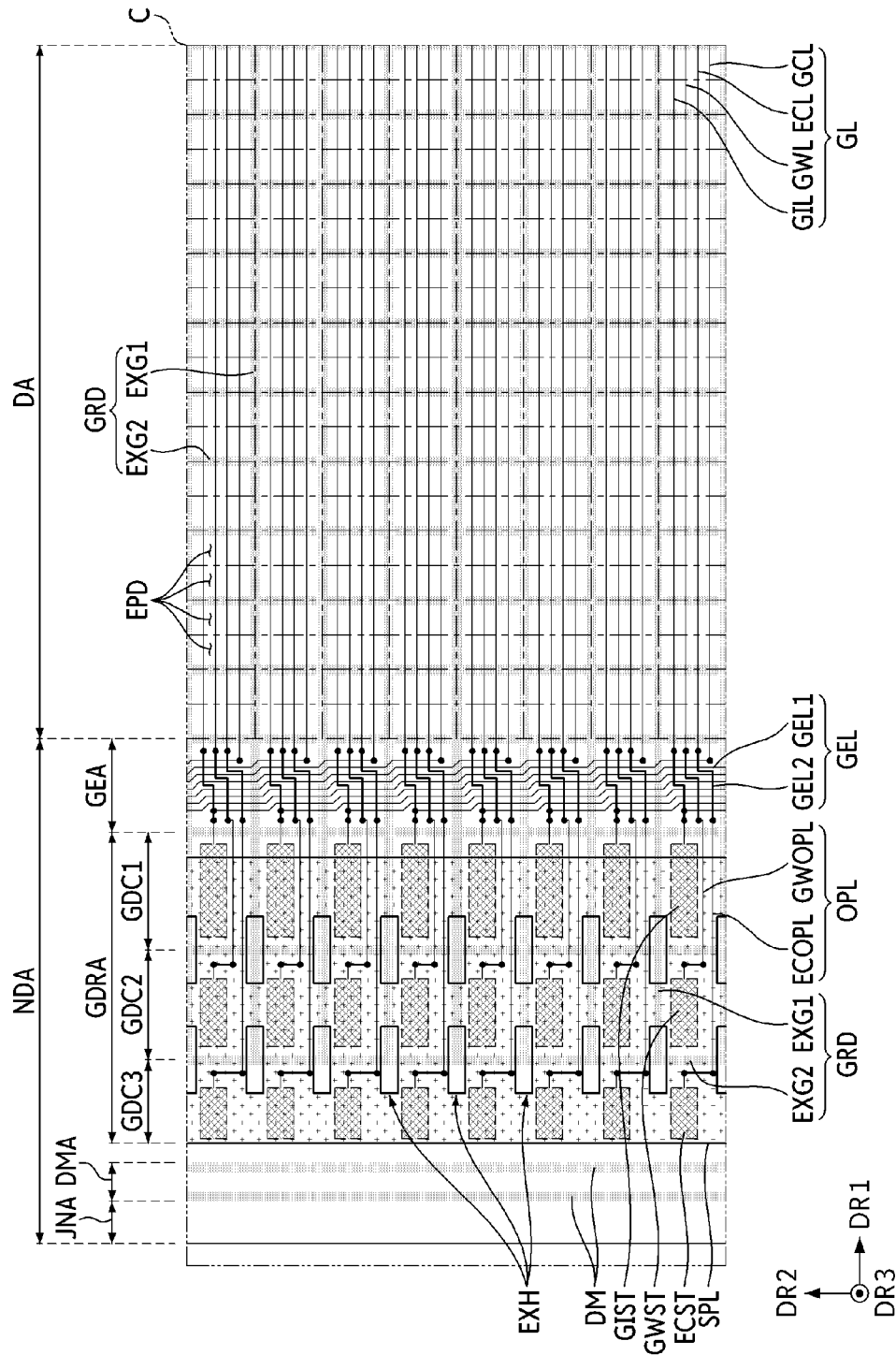
FIG. 15 is a plan view showing part C of FIG. 2 according to an embodiment.

FIG. 13 is a plan view showing part C of FIG. 2 according to an embodiment. FIG. 14 is a cross-sectional view taken along line E-E' of FIG. 13. FIG. 15 is a plan view showing part C of FIG. 2 according to an embodiment.

The display device 100 according to the embodiments illustrated in FIGS. 13, 14, and 15 is substantially the same as the display device 100 according to the embodiments illustrated in FIGS. 1 to 12 except that the circuit layer 120 further includes two or more exposed holes EXH defined through the supply line SPL. Accordingly, any repetitive detailed description of the same or like elements will be omitted.

In an embodiment, as illustrated in FIG. 13, two or more exposed holes EXH may be defined or formed through the supply line SPL and spaced apart from each other.

In an embodiment, for example, two or more exposed holes EXH may be arranged in a matrix from in the first direction DR1 and the second direction DR2.

As illustrated in FIG. 14, each of two or more exposed holes EXH may be defined or formed through the supply line SPL.

Accordingly, the second planarization layer 126 may be in contact with the first planarization layer 125 through two or more exposed holes EXH.

Two or more exposed holes EXH may provide passages for discharging gas of the organic insulating material included in the first planarization layer 125 and the second planarization layer 126. Accordingly, the gas of the organic insulating material may be easily discharged through the exposed holes EXH, such that the lifting defect of the supply line SPL may be reduced.

According to embodiments, the grid filling layer GFL filling the grid GRD includes an organic insulating material, such that the gas of the organic insulating material included in the grid filling layer GFL may also be discharged through the exposed holes EXH.

According to an embodiment, as illustrated in FIG. 13, the grid GRD includes the first extension grooves EXG1 and the second extension grooves EXG2 that intersect each other.

Some of intersection portions between the first extension grooves EXG1 and the second extension grooves EXG2 may overlap two or more exposed holes EXH.

In such an embodiment, the overlapping area between the grid filling layer GFL and two or more exposed holes EXH may be increased, such that the discharge of the gas of the organic insulating material included in the grid filling layer GFL may be facilitated.

In another embodiment, as illustrated in FIG. 15, all of the intersection portions between the first extension grooves EXG1 and the second extension grooves EXG2 may overlap two or more exposed holes EXH.

In such an embodiment, the overlapping area between the grid GRD and two or more exposed holes EXH may be further increased, such that the discharge of the gas of the organic insulating material included in the grid filling layer GFL may be further facilitated.

In an embodiment, as described above with reference to FIG. 5, the light emitting pixel driver EPD includes the first to seventh transistors T1 to T7 provided as P-type MOSFETs. However, this is merely an example, and some of the first to seventh transistors T1 to T7 may be provided as N-type MOSFETs. In another embodiment, for example, the third transistor T3 and the fourth transistor T4 may be provided as N-type MOSFETs.

Figure 16:
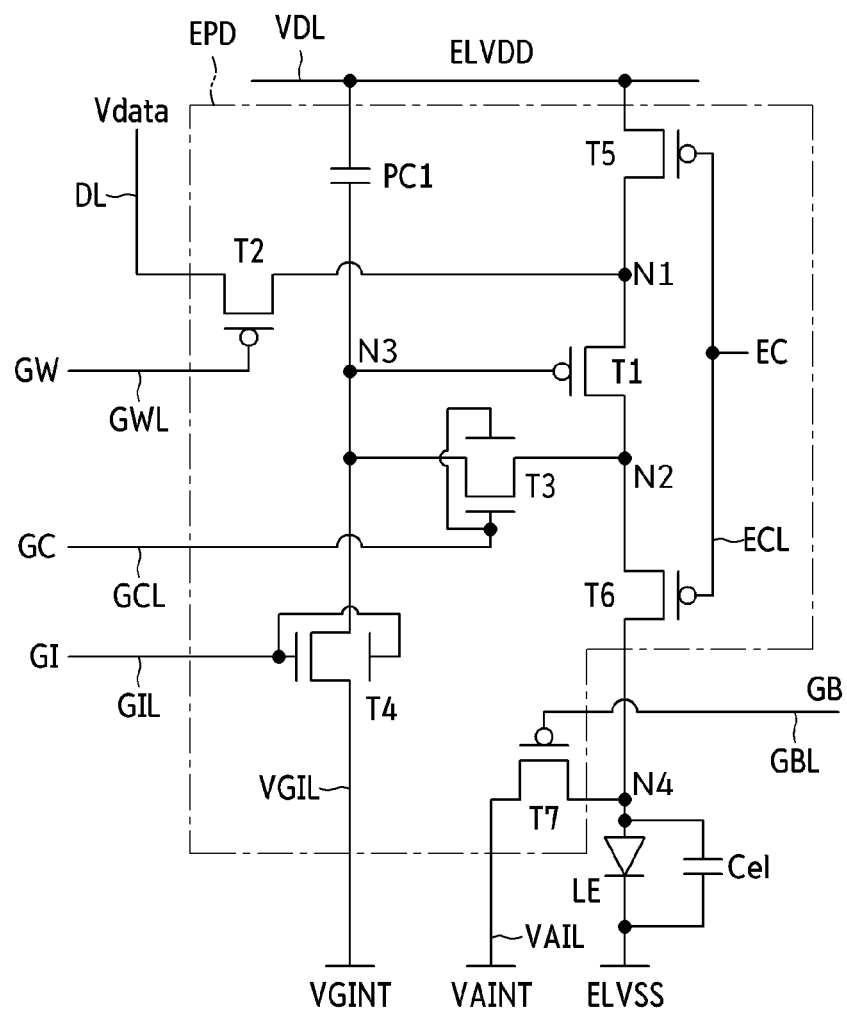
FIG. 16 is an equivalent circuit diagram showing the light emitting pixel driver of FIG. 4 according to an embodiment.

FIG. 16 is an equivalent circuit diagram showing the light emitting pixel driver of FIG. 4 according to an embodiment.

The display device 100 according to an embodiment of FIG. 16 is substantially the same as in the embodiment of FIG. 5 except that the third transistor T3 and the fourth transistor T4 among the first to seventh transistors T1 to T7 of the light emitting pixel driver EPD are provided as N-type MOSFETs. Accordingly, any repetitive detailed description of the same or like elements as those described above will be omitted.

According to an embodiment, as shown in FIG. 16, the third transistor T3 may be electrically connected between the second node N2 and the third node N3. That is, the third transistor T3 may be electrically connected between the gate electrode of the first transistor T1 and the second electrode of the first transistor T1.

In such an embodiment, since the third transistor T3 is provided as an N-type MOSFET, the third transistor T3 may be turned on by the gate control signal GC of the gate control line GCL.

Through the turned-on third transistor T3, the voltage difference between the second node N2 and the third node N3 may be initialized.

The fourth transistor T4 may be electrically connected between the gate initialization voltage line VGIL and the third node N3. That is, the fourth transistor T4 may be connected between the gate electrode of the first transistor T1 and the gate initialization voltage line VGIL.

The fourth transistor T4 may be turned on by the scan initialization signal GI of the scan initialization line GIL.

The potential of the third node N3 may be initialized through the turned-on fourth transistor T4.

In such an embodiment, as the fourth transistor T4 is provided as an N-type MOSFET, the seventh transistor T7 may be turned on by a bias control signal GB of a bias control line GBL, not the scan initialization signal GI of the scan initialization line GIL.

Figure 17:
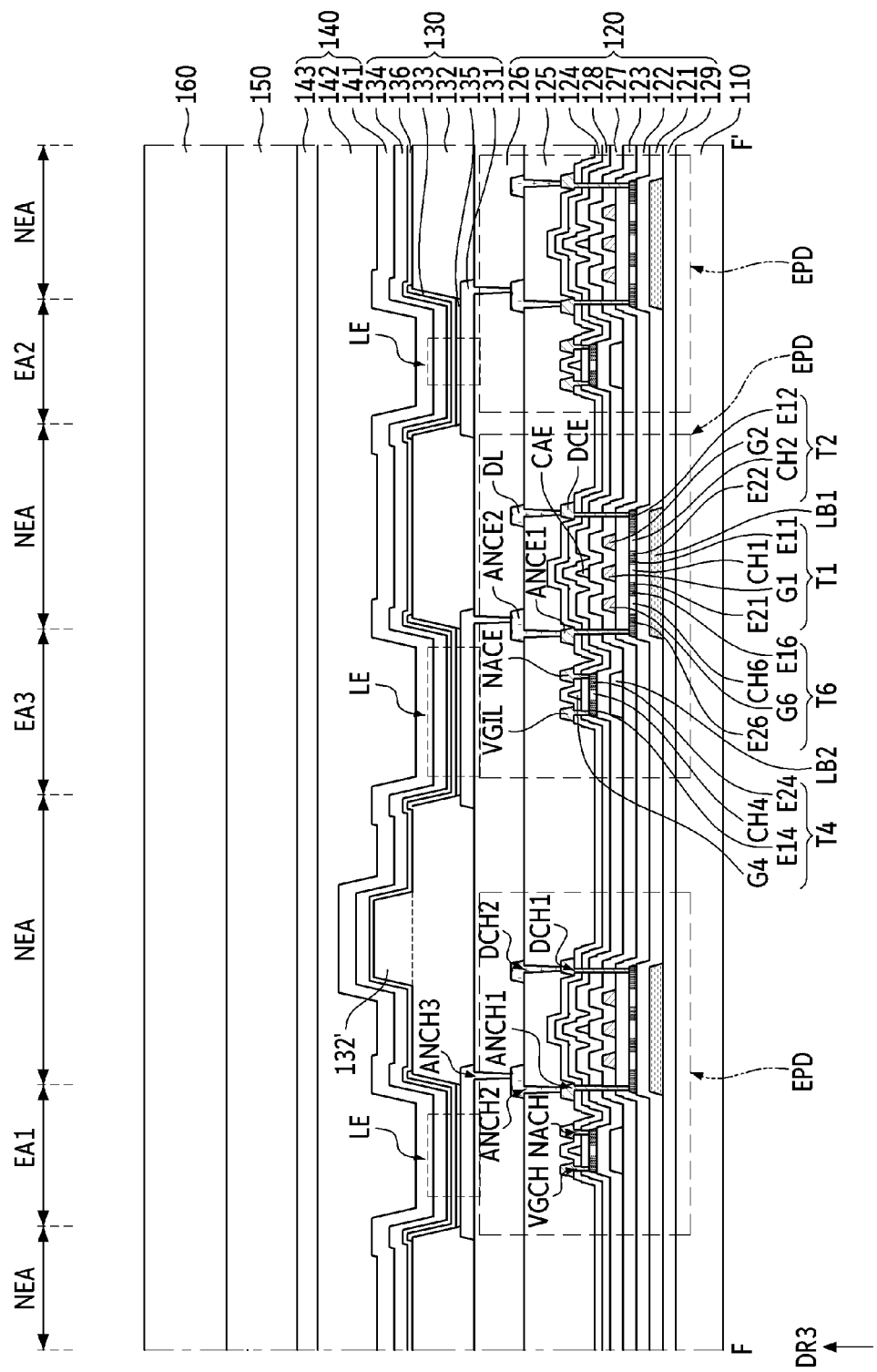
FIG. 17 is a cross-sectional view showing the first transistor, the second transistor, the fourth transistor, the sixth transistor, and the light emitting element of FIG. 16.

FIG. 17 is a cross-sectional view showing the first transistor, the second transistor, the fourth transistor, the sixth transistor, and the light emitting element of FIG. 16.

The circuit layer 120 according to an embodiment illustrated in FIG. 17 is substantially the same as the circuit layer 120 according to the embodiment illustrated in FIG. 6 except that an additional semiconductor layer CH4, E14, and E24, a third gate conductive layer G4, an additional interlayer insulating layer 127, and a third gate insulating layer 128 for providing an N-type MOSFET are further included. Accordingly, any repetitive detailed description of the same or like elements as those described above will be omitted.

According to an embodiment, as shown in FIG. 17, the circuit layer 120 may include the substrate buffer layer 121 disposed on the substrate 110, the semiconductor layer CH1, E11, E21, CH2, E12, E22, CH6, E16, and E26 disposed on the substrate buffer layer 121, the first gate insulating layer 122 covering the semiconductor layer, the first gate conductive layer G1, G2, and G6 disposed on the first gate insulating layer 122, the second gate insulating layer 123 covering the first gate conductive layer, the second gate conductive layer CAE and LB2 disposed on the second gate insulating layer 123, and the interlayer insulating layer 124 covering the second gate conductive layer CAE and LB2.

According to an embodiment, as shown in FIG. 17, the circuit layer 120 may further include the additional semiconductor layer CH4, E14, and E24 disposed on the interlayer insulating layer 124, the third gate insulating layer 127 covering the additional semiconductor layer, the third gate conductive layer G4 disposed on the third gate insulating layer 127, and the additional interlayer insulating layer 128 covering the third gate conductive layer G4.

The circuit layer 120 may include the first source-drain conductive layer ANCE1, VGIL, and DCE disposed on the additional interlayer insulating layer 128, the first planarization layer 125 covering the first source-drain conductive layer, the second source-drain conductive layer DL and ANCE2 disposed on the first planarization layer 125, and the second planarization layer 126 covering the second source-drain conductive layer.

According to an embodiment, as illustrated in FIG. 17, the circuit layer 120 may further include a barrier layer 129 disposed on the substrate 110, and a first light blocking layer LB1 disposed on the barrier layer 129 and covered by the substrate buffer layer 121.

The semiconductor layer on the buffer layer 121 may include the channel portions CH1, CH2, and CH6, the first electrode portions E11, E12, and E16, and the second electrode portions E21, E22, and E26 of the first transistor T1, the second transistor T2, the fifth transistor T5 (see FIG. 16), the sixth transistor T6, and the seventh transistor T7 (see FIG. 16) that are provided as P-type MOSFETs.

The first gate conductive layer on the first gate insulating layer 122 may include the gate electrodes G1, G2, and G6 of the first transistor T1, the second transistor T2, the fifth transistor T5 (see FIG. 16), the sixth transistor T6, and the seventh transistor T7 (see FIG. 16) that are provided as P-type MOSFETs.

Since the fifth transistor T5 and the seventh transistor T7 have a same structure as those of the first transistor T1, the second transistor T2, and the sixth transistor T6, any repetitive detailed description thereof will be omitted.

In each of the first transistor T1, the second transistor T2, and the sixth transistor T6, the channel portions CH1, CH2, and CH6 may overlap the gate electrodes G1, G2, and G6.

The channel portion CH1 of the first transistor T1 may overlap the first light blocking layer LB1 below the buffer layer 121.

In each of the first transistor T1, the second transistor T2, and the sixth transistor T6, the first electrode portions E11, E12, and E16 may be connected to one ends of the channel portions CH1, CH2, and CH6, and the second electrode portions E21, E22, and E26 may be connected to the other ends of the channel portions CH1, CH2, and CH6.

The first electrode portion E11 of the first transistor T1 may be connected to the second electrode portion E22 of the second transistor T2.

The second electrode portion E21 of the first transistor T1 may be connected to the first electrode portion E16 of the sixth transistor T6.

The second gate conductive layer on the second gate insulating layer 123 may include the capacitor electrode CAE and a second light blocking layer LB2.

The additional semiconductor layer on the interlayer insulating layer 124 may include the channel portion CH4, the first electrode portion E14, and the second electrode portion E24 of each of the third transistor T3 (see FIG. 16) and the fourth transistor T4 that are provided as N-type MOSFETs.

The third gate conductive layer on the third gate insulating layer 127 may include the gate electrode G4 of each of the third transistor T3 (see FIG. 16) and the fourth transistor T4 that are provided as N-type MOSFETs.

In each of the third transistor T3 (see FIG. 16) and the fourth transistor T4, the channel portion CH4 may overlap the second light blocking layer LB2 below the interlayer insulating layer 124.

The channel portion CH4 of the fourth transistor T4 may overlap the gate electrode G4 of the fourth transistor T4.

The first electrode portion E14 of the fourth transistor T4 may be connected to one end of the channel portion CH4 of the fourth transistor T4, and the second electrode portion E24 of the fourth transistor T4 may be connected to the other end of the channel portion CH4 of the fourth transistor T4.

Since the third transistor T3 is provided as the same N-type MOSFET as the fourth transistor T4, any repetitive detailed description thereof will be omitted.

The first source-drain conductive layer on the additional interlayer insulating layer 128 may include a first anode connection electrode ANCE1, a data connection electrode DCE, the gate initialization voltage line VGIL, and a node auxiliary connection electrode NACE.

The second source-drain conductive layer on the first planarization layer 125 may include a second anode connection electrode ANCE2 and the data line DL.

The data connection electrode DCE may be electrically connected to the first electrode portion E12 of the second transistor T2 through a first data connection hole DCH1.

The data line DL may be electrically connected to the data connection electrode DCE through a second data connection hole DCH2.

Accordingly, the data line DL may be electrically connected to the first electrode portion E12 of the second transistor T2 through the data connection electrode DCE.

The gate initialization voltage line VGIL may be electrically connected to the first electrode portion E14 of the fourth transistor T4 through a gate initialization voltage connection hole VGCH.

The node auxiliary connection electrode NACE may be electrically connected to the second electrode portion E24 of the fourth transistor T4 through the node auxiliary connection hole NACH.

The element layer 130, the encapsulation layer 140, the touch sensor layer 150, and the polarization layer 160 of the display panel 100 according to an embodiment illustrated in FIG. 17 are substantially the same as those in the embodiment illustrated in FIG. 6, and any repetitive detailed description thereof will be omitted.

Figure 18:
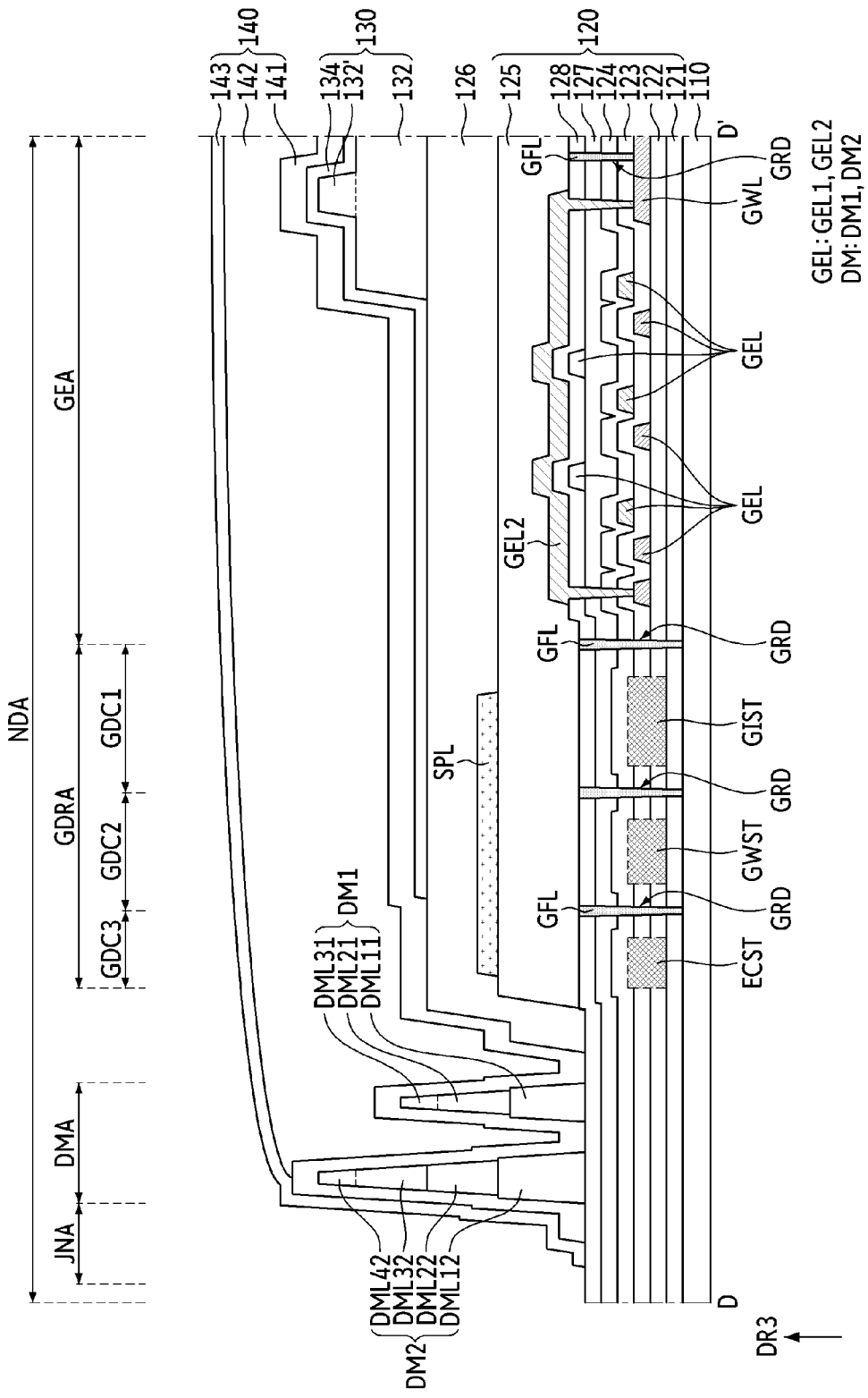
FIG. 18 is a cross-sectional view taken along line D-D' of FIG. 7 according to an embodiment.
Figure 19:
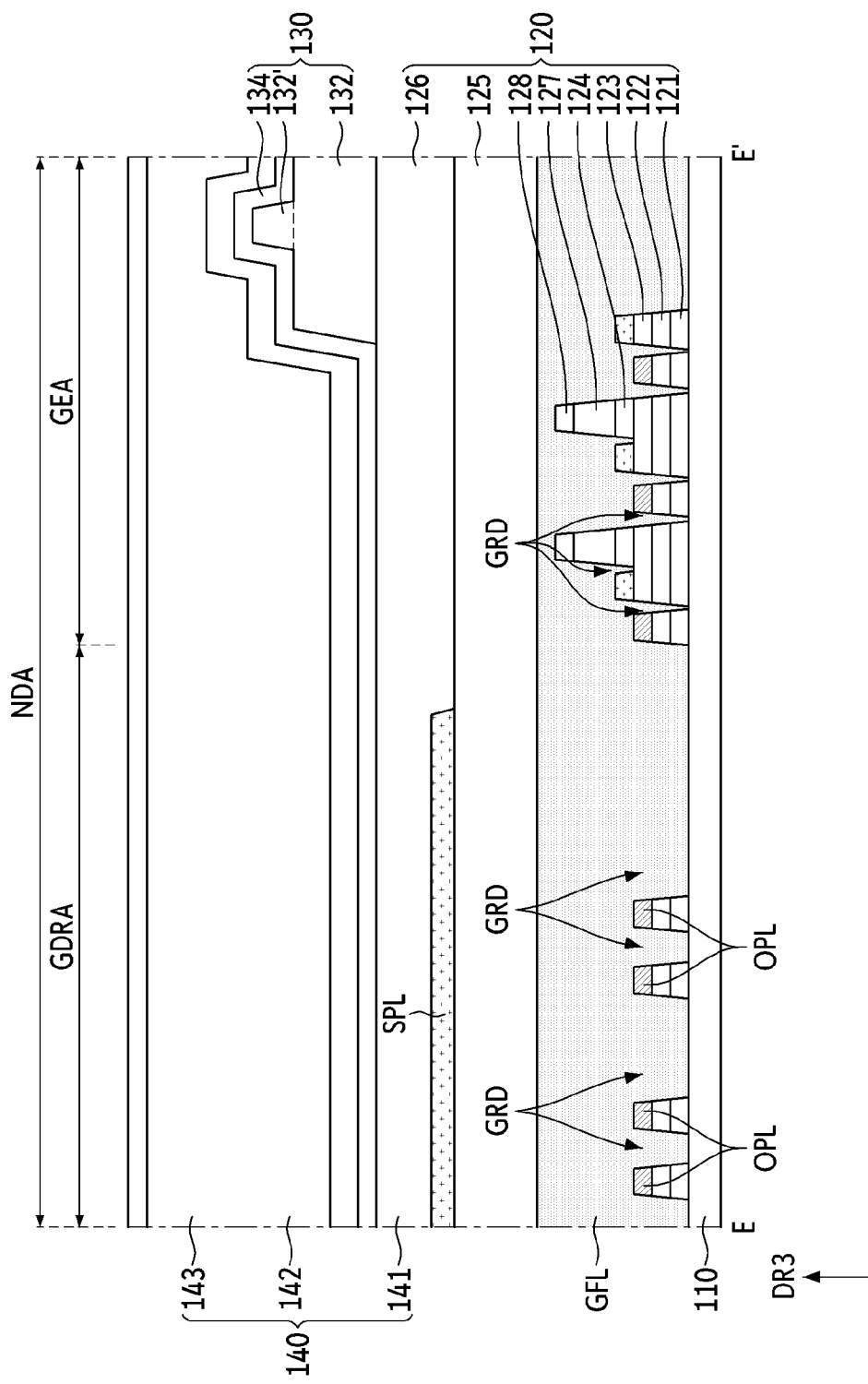
FIG. 19 is a cross-sectional view taken along line E-E' of FIG. 7 according to an embodiment.

FIG. 18 is a cross-sectional view taken along line D-D' of FIG. 7 according to an embodiment. FIG. 19 is a cross-sectional view taken along line E-E' of FIG. 7 according to one embodiment.

The display device 100 according to an embodiment illustrated in FIGS. 18 and 19 is substantially the same as the display device 100 according to the embodiments illustrated in FIGS. 1 to 15 except that the circuit layer 120 further includes an additional semiconductor layer on the interlayer insulating layer 124, the third gate insulating layer 127 covering the additional semiconductor layer, the third gate conductive layer on the third gate insulating layer 127, and the additional interlayer insulating layer 128, and the grid GRD further exposes the third gate conductive layer on the third gate insulating layer 127. Accordingly, any repetitive detailed description of the same or like elements as those described above will be omitted.

According to an embodiment, as illustrated in FIGS. 18 and 19, the grid GRD may be defined or formed through portions of each of two or more insulating layers including an inorganic insulating material, that is, the substrate buffer layer 121, the first gate insulating layer 122, the second gate insulating layer 123, the interlayer insulating layer 124, the third gate insulating layer 127, and the additional interlayer insulating layer 128.

Accordingly, the grid GRD may reach or expose a part of each of the substrate 110, the first gate conductive layer on the first gate insulating layer 122, the second gate conductive layer on the second gate insulating layer 123, and the third gate conductive layer on the third gate insulating layer 127.

In the process of etching two or more insulating layers 121 to 124, 127, and 128 to form the grid GRD, a portion of each of the substrate buffer layer 121, the first gate insulating layer 122, the second gate insulating layer 123, the interlayer insulating layer 124, and the third gate insulating layer 127 disposed under the third gate conductive layer may remain due to the third gate conductive layer.

Accordingly, a portion of the grid GRD where the first gate conductive layer intersects may be in contact with (or expose) the first gate conductive layer, another portion where the second gate conductive layer intersects may be in contact with (or expose) the second gate conductive layer, yet another portion where the third gate conductive layer intersects may be in contact with (or expose) the third gate conductive layer, and the remaining portion may be in contact with (or expose) the substrate 110.

In addition, the grid GRD may be formed at at least some of the boundaries between the light emitting pixel drivers EPD and at least some of the boundaries between the stages GIST, GWST, and ECST, and thus may be separated from the semiconductor layer for providing the transistors and the additional semiconductor layer.

Additionally, according to an embodiment, each of the scan write line GWL and the first gate extension line GEL1 may be disposed in or defined by one of the first gate conductive layer on the first gate insulating layer 122, the second gate conductive layer on the second gate insulating layer 123, and the third gate conductive layer on the third gate insulating layer 127.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate comprising a display area in which emission areas are arranged and a non-display area disposed around the display area;
   a circuit layer disposed on the substrate; and
   an element layer disposed on the circuit layer,
   wherein the circuit layer comprises:
   a substrate buffer layer disposed on the substrate;

a semiconductor layer disposed on the substrate buffer layer;

a first gate insulating layer covering the semiconductor layer;

a first gate conductive layer disposed on the first gate insulating layer;

a second gate insulating layer covering the first gate conductive layer;

a second gate conductive layer disposed on the second gate insulating layer;

an interlayer insulating layer covering the second gate conductive layer;

a grid defined by grooves defined in the display area and the non-display area, wherein the grooves comprise first extension grooves and second extension grooves which intersect the first extension grooves; and a grid filling layer which fills the grid and includes an organic insulating material.

2. The display device of claim 1, wherein the grid exposes a part of each of the substrate, the first gate conductive layer, and the second gate conductive layer.

3. The display device of claim 2, wherein the element layer comprises light emitting elements disposed in the emission areas, respectively, and the circuit layer further comprises:
light emitting pixel drivers electrically connected to the light emitting elements, respectively;
gate lines which transmit a gate signal to the light emitting pixel drivers; and
a gate driving circuit disposed in a gate driving area of the non-display area, wherein the gate driving circuit supplies the gate signal to the gate lines,
wherein the gate driving circuit comprises stages electrically connected to the gate lines, respectively,
in an extension direction of the second extension grooves, one or more light emitting pixel drivers and one or more stages are disposed between two adjacent first extension grooves among the first extension grooves of the grid, and
in an extension direction of the first extension grooves, one or more light emitting pixel drivers are disposed between two adjacent second extension grooves in the display area among the second extension grooves of the grid.

4. The display device of claim 3, wherein the gate lines comprise:
scan write lines which transmit a scan write signal;
scan initialization lines which transmit a scan initialization signal;
emission control lines which transmit an emission control signal; and
gate control lines which transmit a gate control signal,
wherein the stages of the gate driving circuit comprise:
initialization stages arranged in a first circuit area of the gate driving area, and electrically connected to the scan initialization lines and the gate control lines;
write stages arranged in a second circuit area of the gate driving area, and electrically connected to the scan write lines; and
emission control stages arranged in a third circuit area of the gate driving area, and electrically connected to the emission control lines,
wherein at least one of the second extension grooves among the second extension grooves of the grid are disposed in the non-display area between the first circuit area, the second circuit area, and the third circuit area.

5. The display device of claim 4, wherein the non-display area further comprises an extension line area disposed between the gate driving area and the display area,
the circuit layer further comprises gate extension lines disposed in the extension line area and electrically connected between the stages and the gate lines, and
two second extension grooves among the second extension grooves of the grid are dispose at opposing sides of the extension line area, respectively.

6. The display device of claim 4, wherein one light emitting pixel driver electrically connected to one light emitting element among the light emitting pixel drivers comprises:
a first transistor electrically connected between a first node and a second node;
a pixel capacitor electrically connected between a first power line and a third node;
a second transistor electrically connected between a data line, which transmits a data signal, and the third node;
a third transistor electrically connected between the second node and the third node;
a fourth transistor electrically connected between a first initialization voltage line, which transmits a first initialization voltage, and the third node;
a fifth transistor electrically connected between the first power line and the first node;
a sixth transistor electrically connected between the second node and a fourth node; and
a seventh transistor electrically connected between a second initialization voltage line, transmits a second initialization voltage, and the fourth node,
wherein the first node is electrically connected to a first electrode of the first transistor,
the second node is electrically connected to a second electrode of the first transistor,
the third node is electrically connected to a gate electrode of the first transistor,
the fourth node is electrically connected to the one light emitting element,
each of the second transistor and the third transistor is turned on by the scan write signal,
the fourth transistor is turned on by the scan initialization signal,
each of the fifth transistor and the sixth transistor is turned on by the emission control signal, and
the seventh transistor is turned on by the gate control signal.

7. The display device of claim 4, wherein the grid is spaced apart from the semiconductor layer in a plan view.

8. The display device of claim 4, wherein the circuit layer further comprises a supply line disposed in the non-display area and surrounding at least a part of an edge portion of the display area, and
a part of the supply line overlaps the gate driving area in a plan view.

9. The display device of claim 8, wherein the circuit layer further comprises:
a first source-drain conductive layer disposed on the interlayer insulating layer;
a first planarization layer covering the first source-drain conductive layer and the grid;
a second source-drain conductive layer disposed on the first planarization layer; and a second planarization layer covering the second source-drain conductive layer,
wherein the supply line is disposed on the second source-drain conductive layer.

10. The display device of claim 9, wherein two or more exposed holes are defined through the supply line to be spaced apart from each other in the plan view,
the second planarization layer is in contact with the first planarization layer through the two or more exposed holes, and
two or more of intersection portions between the first extension grooves and the second extension grooves overlap the two or more exposed holes, respectively, in the plan view.

11. The display device of claim 2, wherein the circuit layer further comprises a grid buffer layer disposed between the grid and the grid filling layer and including an inorganic insulating material.

12. The display device of claim 2, wherein the circuit layer further comprises:
an additional semiconductor layer disposed on the interlayer insulating layer;
a third gate insulating layer covering the additional semiconductor layer;
a third gate conductive layer disposed on the third gate insulating layer; and
an additional interlayer insulating layer covering the third gate conductive layer,
wherein the grid further exposes a part of the third gate conductive layer.

13. A display device comprising:
a substrate comprising a display area in which emission areas are arranged and a non-display area disposed around the display area;
a circuit layer disposed on the substrate; and
an element layer disposed on the circuit layer,
wherein the element layer comprises light emitting elements disposed in the emission areas, respectively, and the circuit layer comprises:
light emitting pixel drivers electrically connected to the light emitting elements, respectively;
gate lines which transmit a gate signal to the light emitting pixel drivers;
a gate driving circuit disposed in a gate driving area of the non-display area and comprising stages electrically connected to the gate lines, respectively;
two or more insulating layers disposed on the substrate and including an inorganic insulating material;
a grid defined by grooves defined in at least some of boundaries between the light emitting pixel drivers and at least some of boundaries between the stages through the two or more insulating layers; and
a grid filling layer which fills the grid and includes an organic insulating material.

14. The display device of claim 13, wherein the two or more insulating layers comprise:
a substrate buffer layer disposed on the substrate;
a first gate insulating layer disposed on the substrate buffer layer;
a second gate insulating layer disposed on the first gate insulating layer; and
an interlayer insulating layer disposed on the second gate insulating layer,
wherein the circuit layer further comprises:
a semiconductor layer disposed between the substrate buffer layer and the first gate insulating layer;
a first gate conductive layer disposed between the first gate insulating layer and the second gate insulating layer; and
a second gate conductive layer disposed between the second gate insulating layer and the interlayer insulating layer,
wherein the grid exposes a part of each of the substrate, the first gate conductive layer, and the second gate conductive layer, and is spaced apart from the semiconductor layer in a plan view.

15. The display device of claim 14, wherein the grooves of the grid comprises first extension grooves and second extension grooves which intersect the first extension grooves,
in an extension direction of the second extension grooves, one or more light emitting pixel drivers and one or more stages are disposed between two adjacent first extension grooves among the first extension grooves of the grid, and
in an extension direction of the first extension grooves, one or more light emitting pixel drivers are disposed between two adjacent second extension grooves in the display area among the second extension grooves of the grid.

16. The display device of claim 15, wherein the gate lines comprise:
scan write lines which transmit a scan write signal;
scan initialization lines which transmit a scan initialization signal;
emission control lines which transmit an emission control signal; and
gate control lines which transmit a gate control signal,
wherein the stages of the gate driving circuit comprise:
initialization stages arranged in a first circuit area of the gate driving area, and electrically connected to the scan initialization lines and the gate control lines;
write stages arranged in a second circuit area of the gate driving area, and electrically connected to the scan write lines; and
emission control stages arranged in a third circuit area of the gate driving area, and electrically connected to the emission control lines,
wherein at least one of the second extension grooves among the second extension grooves of the grid are disposed in the non-display area between the first circuit area, the second circuit area, and the third circuit area.

17. The display device of claim 16, wherein the non-display area further comprises an extension line area disposed between the gate driving area and the display area,
the circuit layer further comprises gate extension lines disposed in the extension line area and electrically connected between the stages and the gate lines, and
two second extension grooves among the second extension grooves of the grid are disposed at opposing sides of the extension line area, respectively.

18. The display device of claim 16, wherein the circuit layer further comprises:
a first source-drain conductive layer disposed on the interlayer insulating layer;
a first planarization layer covering the first source-drain conductive layer and the grid;
a second source-drain conductive layer disposed on the first planarization layer;
a second planarization layer covering the second source-drain conductive layer; and a supply line disposed in the non-display area and surrounding three sides of the display area, wherein the supply line is disposed in the second source-drain conductive layer, and a part of the supply line overlaps the gate driving area in the plan view.

19. The display device of claim 18, wherein two or more exposed holes are defined through the supply line to be spaced apart from each other in the plan view, the second planarization layer is in contact with the first planarization layer through the two or more exposed holes, and two or more of intersection portions between the first extension grooves and the second extension grooves overlap the two or more exposed holes, respectively, in the plan view.

20. The display device of claim 13, wherein the circuit layer further comprises a grid buffer layer disposed between the grid and the grid filling layer and including an inorganic insulating material.

* * * * *